United States Patent [19]
Kawaguchi et al.

[11] Patent Number: 6,039,111
[45] Date of Patent: Mar. 21, 2000

[54] COOLING DEVICE BOILING AND CONDENSING REFRIGERANT

[75] Inventors: Kiyoshi Kawaguchi, Toyota; Shigeru Kadota, Hekinan; Kouji Kishita, Motosu-gun, all of Japan

[73] Assignee: Denso Corporation, Kariya, Japan

[21] Appl. No.: 09/024,977

[22] Filed: Feb. 16, 1998

[30] Foreign Application Priority Data

| Feb. 14, 1997 | [JP] | Japan | 9-030406 |
| Mar. 19, 1997 | [JP] | Japan | 9-066555 |
| Mar. 19, 1997 | [JP] | Japan | 9-066728 |

[51] Int. Cl.⁷ ............ F28D 15/02; H05K 7/20
[52] U.S. Cl. ............ 165/104.14; 165/104.33; 165/122; 361/696; 361/700
[58] Field of Search ............ 165/104.14, 104.33, 165/122; 361/696, 700

[56] References Cited

U.S. PATENT DOCUMENTS

| 3,807,493 | 4/1974 | Stewart | 165/104.33 X |
| 4,600,050 | 7/1986 | Noren | |
| 4,706,739 | 11/1987 | Noren | 165/104.14 |
| 4,745,965 | 5/1988 | Katsura et al. | 165/104.14 |
| 5,035,281 | 7/1991 | Neuenfeldt et al. | 165/76 |

FOREIGN PATENT DOCUMENTS

| 55-140092 | 11/1980 | Japan |
| 59-29986 | 2/1984 | Japan |
| B2-2-3320 | 1/1990 | Japan |
| B2-4-70800 | 11/1992 | Japan |
| 5-102687 | 4/1993 | Japan |

*Primary Examiner*—Allen Flanigan
*Attorney, Agent, or Firm*—Harness, Dickey & Pierce, PLC

[57] ABSTRACT

A cooling device includes: a partition plate for partitioning an interior of a case into a first fluid passage through which first fluid having a high temperature flows and a second fluid passage through which second fluid having a low temperature flows; a heat receiving portion disposed in the first fluid passage; a heat radiating portion disposed in the second fluid passage; and a connection pipe for communicating the heat receiving portion and the heat radiating portion. The heat radiating portion is disposed at an upper side of the heat receiving portion in such a manner that the second fluid from a front side of the heat radiating portion flows into a rear side of the heat radiating portion through a pipe space between the heat radiating portion and the heat receiving portion, and further passes through the heat radiating portion from the rear side toward the front side of the heat radiating portion. Thus, the cooling device has a small size while improving the cooling capacity of the cooling device.

30 Claims, 15 Drawing Sheets

COOLING DEVICE BOILING AND CONDENSING REFRIGERANT

CROSS-REFERENCE TO RELATED APPLICATION

This application is related to and claims priorities from Japanese Patent Applications No. Hei. 9-30406 filed on Feb. 14, 1997, No. Hei. 9-66555 filed on Mar. 19, 1997, and No. Hei. 9-66728 filed on Mar. 19, 1997.

BACKGROUND OF THE INVENTION

1. Field of the Invention

The present invention relates to a cooling device for cooling an interior of a sealed housing for accommodating a heat-generating member such as an electronic part.

2. Description of Related Art

Conventionally, a heat-generating member such as an electronic part is used while being located in a sealed housing. Because outside air cannot be circulated inside the housing for ventilation in this case, a heat exchange between air inside the housing and air outside the housing is performed to cool the heat-generating member.

For example, in a cooling device described in JP-B2-2-3320, a heat pipe is disposed along a side wall surface of a housing. Heat exchange between air inside the housing and air outside the housing is performed through the heat pipe. That is, as shown in FIG. 15, a lower portion 210 of the heat pipe 200 is disposed within the housing having a high temperature, and an upper portion 220 of the heat pipe 200 is disposed outside the housing. However, when the heat pipes are disposed in multiple layers, it is necessary to provide an air-blowing passage at the outside of the lower portion 210 or the upper portion 220 as shown by an arrow C in FIG. 15. Therefore, the size of the cooling device becomes large. On the other hand, when an upper side fan is disposed on the upper side of the upper portion 220 and a lower side fan is disposed on the lower side of the lower portion 210, the lateral width of the heat pipe 200 can be made small. However, in this case, velocity distribution of the heat pipe 200 in the longitudinal direction becomes uniform, thereby decreasing the cooling effect of the cooling device.

On the other hand, in a cooling device described in JP-B2-4-70800, each of heat pipes is bent at the center portions to increase cooling capacity. However, when the amount of heat generated by the electronic parts is increased, a large number of heat pipes are necessary and the manufacturing cost of the heat pipes is increased by the bending of the heat pipes.

SUMMARY OF THE INVENTION

In view of the foregoing problems, it is a first object of the present invention to provide a cooling device which has a small size while improving its cooling performance.

It is a second object of the present invention to provide a cooling device in which a first fluid passes through a first heat exchanger and a second fluid passes through a second heat exchanger in the same flow directions. The cooling device has sufficient cooling performance without increasing the size of the cooling device.

It is a third object of the present invention to provide a cooling device which has a small thickness in a lateral direction and has a uniform velocity distribution in a longitudinal direction.

It is a fourth object of the present invention to provide a cooling device in which a low cost heat exchanger is manufactured even when the heat exchanger has a bent portion.

It is fifth object of the present invention to provide a cooling device in which a low cost heat exchanger is manufactured even when the heat exchanger has a bent portion, while the cooling device has a small thickness in a lateral direction and a uniform velocity distribution in a longitudinal direction.

According to a first aspect of the present invention, a cooling device includes a fluid partition member for partitioning an interior of a case into a first fluid passage through which a first fluid flows and a second fluid passage through which a second fluid flows. The first fluid passage has a first fluid-flowing portion between a first heat exchanger disposed in the first fluid passage and a second heat exchanger disposed in the second fluid passage. The first heat exchanger and the second heat exchanger are disposed in such a manner that the first fluid from one side of the first heat exchanger flows into the other side of the first heat exchanger through the first fluid-flowing portion and further passes through the first heat exchanger from the other side toward the one side of the first heat exchanger. Therefore, it is not necessary to form an air passage for leading the first fluid into the rear side of the first heat exchanger from the outside of the first heat exchanger and the second heat exchanger. Thus, by effectively using the first fluid-flowing portion between the first heat exchanger and the second heat exchanger, a size of the cooling device is decreased while improving cooling performance.

According to a second aspect of the present invention, a cooling device includes a first heat exchanger and a second heat exchanger disposed in such a manner that a flow direction of a first fluid passing through the first heat exchanger is in the same direction as a flow direction of a second fluid passing through the second heat exchanger. The first heat exchanger has a first arrangement where a plurality of first heat exchanger portions are disposed in the flow direction of the first fluid. The second heat exchanger has a second arrangement where a plurality of second heat exchanger portions are disposed in the flow direction of the second fluid. The number of second heat exchanger portions is the same as the number of first heat exchanger portions. Further, the first heat exchanger portions are disposed below the second heat exchanger portions in such a manner that the first arrangement is opposite to the second arrangement. Thus, by bending only the connection pipe, the cooling device has sufficient cooling performance without increasing the size of the cooling device, and the cooling device is manufactured at a low cost.

According to a third aspect of the present invention, a cooling device includes a first heat exchanger and a second heat exchanger. The first heat exchanger is disposed below the second heat exchanger and shifted to a side of a second blower unit in a lateral direction of the second heat exchanger. The second blower unit and the second heat exchanger are disposed above the first heat exchanger to be shifted to a side of the first blower unit in a lateral direction of the first heat exchanger and the first blower unit. Further, connection pipes connecting the first heat exchanger and the second heat exchanger are smaller in number than either the number of the first pipes or the number of the second pipes. Thus, the cooling device can be manufactured in low cost even if the connection pipes are bent.

According to a fourth aspect of the present invention, a cooling device include: a first blower unit has a first end at a side of a first heat exchanger and a second end at a side opposite to the first end. A second blower unit has a first end at a side of a second heat exchanger and a second end at a side opposite to the first end. Further, the first blower unit and the second blower unit are disposed in such a manner that a distance between the second end of the first blower unit and the second end of the second blower unit in the lateral direction is smaller than a total thicknesses of the first and second blower units and the thickness between the first heat exchanger and the second heat exchanger in the lateral direction. Thus, the cooling device has a small thickness in the lateral direction and an uniform velocity distribution in a longitudinal direction.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention are described hereinafter with reference to the accompanying drawings.

A first preferred embodiment of the present invention will be now described.

Figure 1:
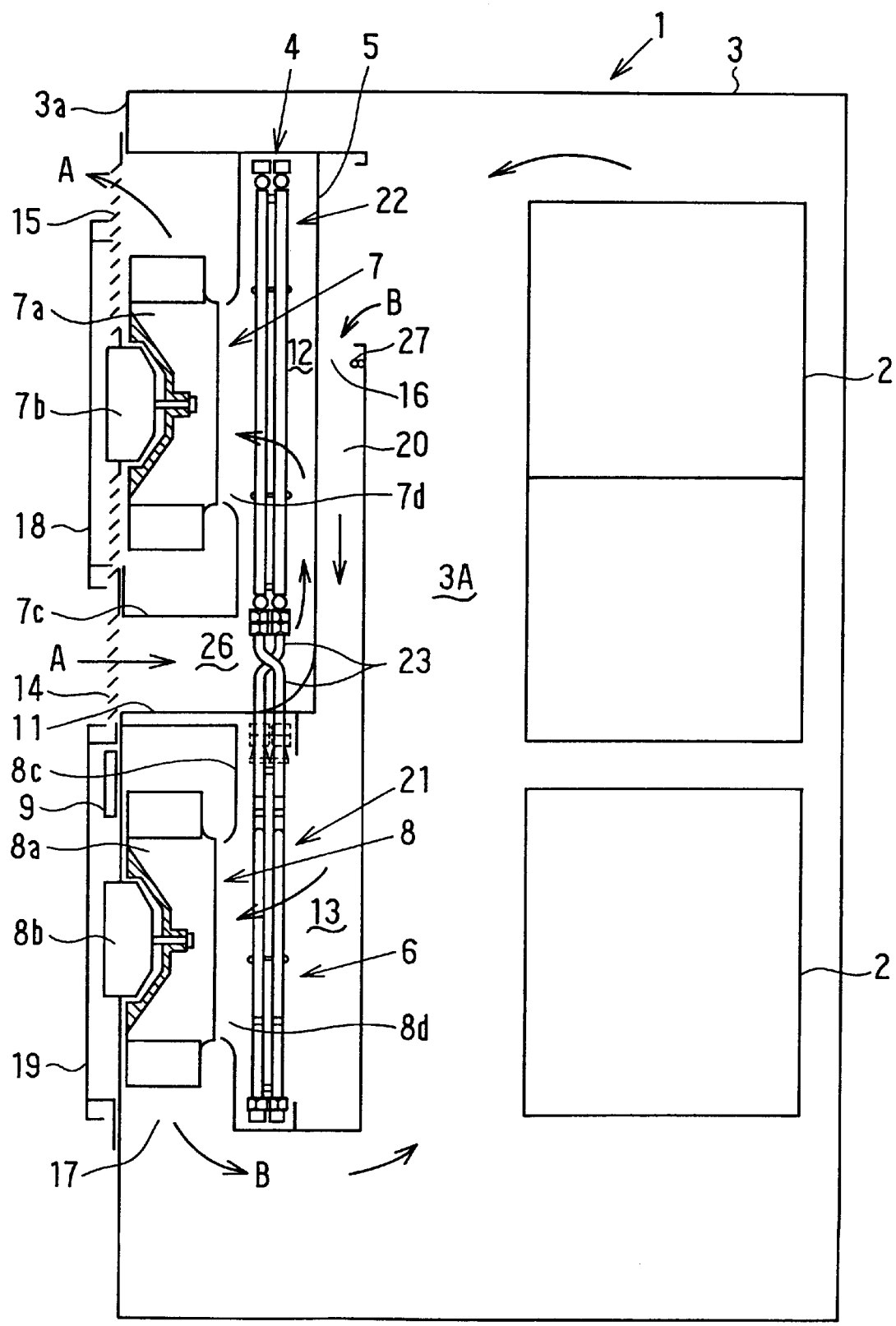
FIG. 1 is a schematic cross-sectional view showing a cooling device according to a first preferred embodiment of the present invention.
Figure 2:
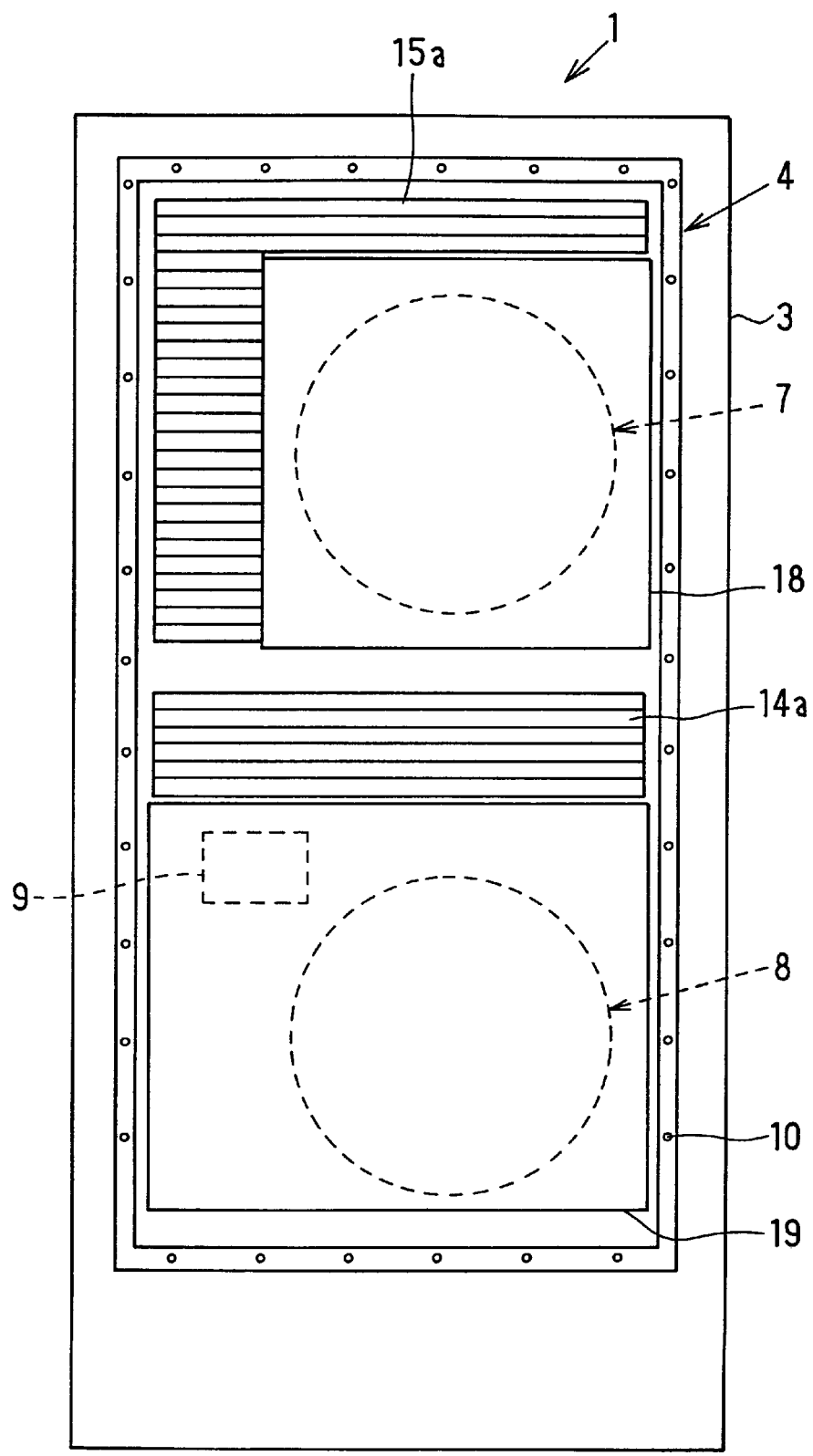
FIG. 2 is a front view of the cooling device when viewed from a left side in FIG. 1.

As shown in FIGS. 1 and 2, a cooling device 1 is applied to a radio base station of a mobile radio telephone such as a pocket telephone or a vehicle telephone. The cooling device 1 includes a housing 3 for accommodating electric parts 2, and a cooling unit 4 (hereinafter referred to as "panel cooler 4"). The panel cooler 4 is inserted into the housing 3 to cool the interior of the housing 3.

The electric parts 2 are a heat-generating member which perform an electric operation and generate heat when an electric power is applied thereto. For example, the electronic parts 2 are a semiconductor switching element forming a high-frequency circuit installed in a transceiver, or a power transistor installed in a power amplifier.

The housing 3 is formed in a box-shape, and is made of metal such as aluminum. An opening portion is provided in a front plate 3a (i.e., plate at a left side in FIG. 1), and the panel cooler 4 is air-tightly inserted into the opening portion of the front plate 3a to hermetically seal an inner space 3A of the housing 3.

The panel cooler 4 includes: a casing 5; a boiling unit 6 (i.e., heat exchanger) contained in the casing 5, an upper side blower unit 7 at a low temperature side, a lower side blower unit 8 at a high temperature side; and a controller 9. After hermetically inserting the panel cooler 4 into the opening portion of the front plate 3a of the housing 3, the panel cooler 4 is fixed to a periphery portion of the opening portion by screws or bolts 10, as shown in FIG. 2.

An inner space of the housing 5 is partitioned by a partition plate 11 into a low-temperature-side heat transmission space 12 and a high-temperature-side heat transmission space 13. The housing 5 includes: an outside air intake port 14 and an outside air exhaust port 15 for communicating the low-temperature-side heat transmission space 12 with the outside of the housing 3; and an inside air intake port 16 and an inside air exhaust port 17 for communicating the high-temperature-side heat transmission space 13 with the inner space 3A of the housing 3. Further, maintenance hatches 18 and 19 of the upper side blower unit 7 and lower side blower unit 8 are respectively detachably attached to the front surface of the casing 5 as shown in FIG. 2.

As shown in FIG. 2, louvers 14a and 15a are provided on the front surface of the casing 5 to prevent a foreign object from entering the casing 5 from the outside air intake port 14 and the outside air exhaust port 15. As shown in FIG. 1, the outside air intake port 14 is opened at a lower side of the partition plate 11, and the outside air exhaust port 15 is provided at a position higher than the outside air intake port 14.

Further, the inside air intake port 16 is provided at a rear side (i.e., right side in FIG. 1) of the casing 5 to be opened toward an upper side of the casing 5, and the inside air exhaust port 17 is opened at a bottom of the casing 5. The most rear surface of the casing 5 is placed at a rear side of the low-temperature-side heat transmission space 12 (i.e., the right side in FIG. 1), and an inside air introduction passage 20 extending in an up-down direction in FIG. 1 is formed between the most rear surface of the casing 5 and the rear surface of low-temperature-side heat transmission space 12.

The boiling unit 6 includes a heat receiving portion 21 disposed approximately vertically in the high-temperature-side heat transmission space 13, a heat-radiating portion 22 disposed approximately vertically in the low-temperature-side heat transmission space 12, and a connection pipe 23 for connecting the heat receiving portion 21 and the heat radiating portion 22. A predetermined amount of refrigerant is sealed within the boiling unit 6 through a tube. As the refrigerant, $CH_2FCF_3$ or water may be used. A liquid refrigerant is sealed within the boiling unit 6 at a level approximately corresponding to the partition plate 11 when the boiling unit 6 is not operated. In the first embodiment, the panel cooler 4 includes two boiling units 6. Because both boiling units 6 have the same structure, only one boiling unit 6 is described.

Figure 3:
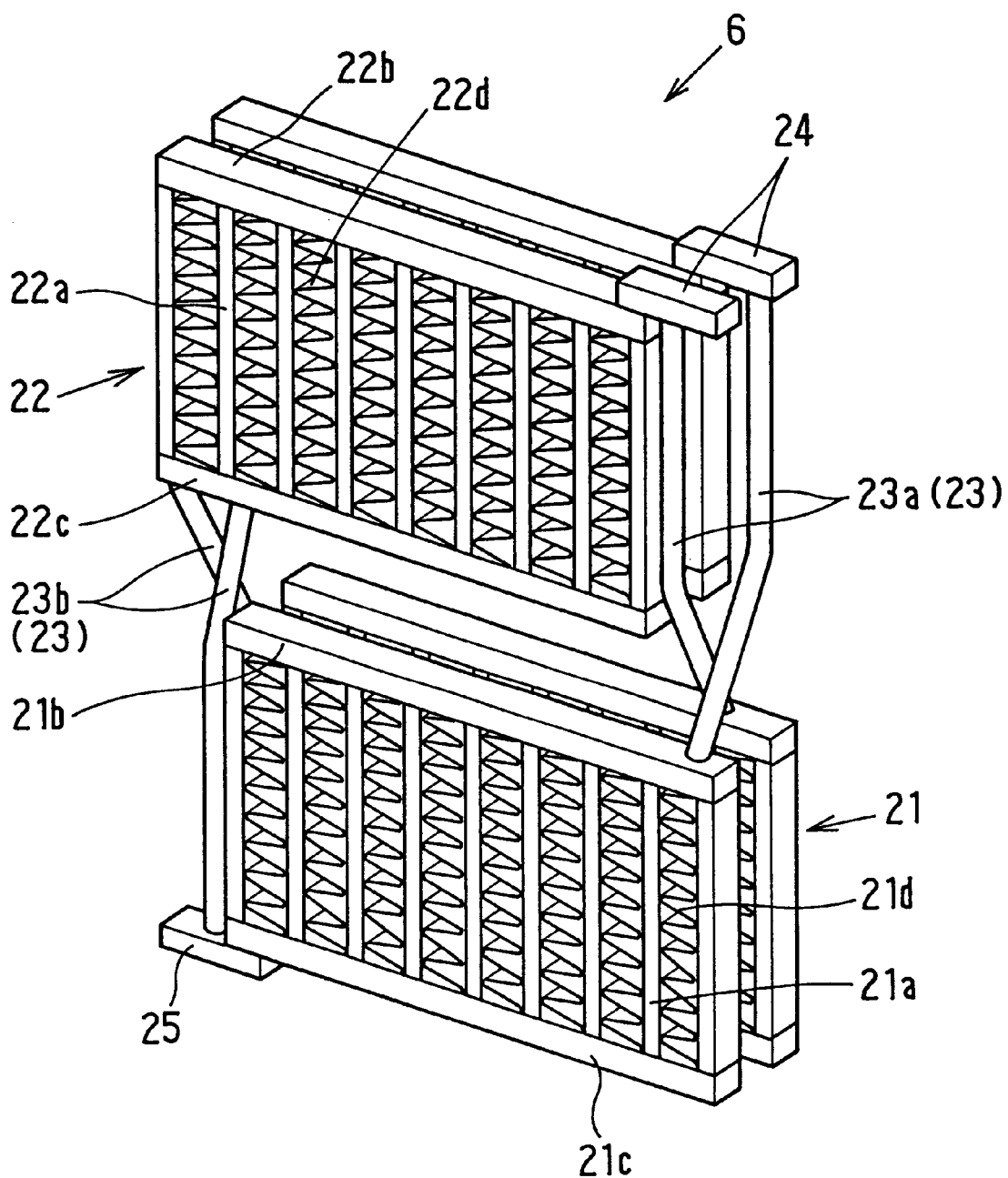
FIG. 3 is a perspective view showing a boiling unit according to the first embodiment.

As shown in FIG. 3, the heat receiving portion 21 includes a plurality of heat receiving pipes 21a disposed in parallel, upper and lower tanks 21b and 21c connected to two ends of each heat receiving pipe 21a to communicate the heat receiving pipes 21a with each other, and heat transmission fins 21d disposed between adjacent the heat receiving pipes 21a. Those parts are brazed integrally to form the heat receiving portion 21.

Each of the heat receiving pipes 21a is made of metal, having a sufficient heat transmission performance, such as aluminum or copper, and is formed in an elliptical shape or a rectangular shape in cross-section. Each of the upper tank 21b and the lower tank 21c is made of the same metal as the heat receiving pipes 21a, and is formed in a tube shape. The ends of the heat receiving pipes 21a are inserted into the upper and lower tanks 21b and 21c a predetermined distance in a longitudinal direction of the upper and lower tank 21b and 21c. The heat transmission fins 21d are corrugated fins made of a thin plate formed into a wave shape by bending the metal in alternate directions. Each corrugated fin is connected to wall surfaces of the heat receiving pipes 21a at the bent portions.

As shown in FIG. 3, the heat radiating portion 22 includes a plurality of heat radiating pipes 22a disposed in parallel, upper and lower tanks 22b and 22c connected to two ends of each heat radiating pipe 22a to communicate the heat radiating pipes 22a with each other, and heat transmission fins 22d disposed between adjacent heat radiating pipes 22a. Those parts are brazed integrally to form the heat radiating portion 22.

Each of the heat radiating pipes 22a is made of metal, having a sufficient heat transmission performance, such as aluminum or copper, and is formed in an elliptical shape or a rectangular shape in cross-section. Each of the upper tank 22b and the lower tank 22c is made of the same metal as the heat radiating pipes 22a, and is formed in a tube shape. The ends of the heat radiating pipes 22a are inserted into the upper and lower tanks 22b and 22c in a predetermined distance in a longitudinal direction of the upper and lower tank 22b and 22c. The heat transmission fins 22d are corrugated fins made of a thin plate formed into a wave shape by bending the metal in alternate directions. Each corrugated fin is connected to wall surfaces of the heat radiating pipes 22a at the bent portions.

The connection pipe 23 is made of metal such as aluminum or copper, and is integrally brazed with the heat receiving portion 21 and the heat radiating portion 22. The connection pipe 23 includes a first connection pipe 23a for introducing a refrigerant vapor vaporized in the heat receiving portion 21 into the heat radiating portion 22, and a second connection pipe 23b for introducing a condensed and liquified refrigerant into the heat receiving portion 21. Both the first and second connection pipes 23a and 23b hermetically penetrate through the partition plate 11, and connect the heat receiving portion 21 and heat radiating portion 22.

As shown in FIG. 3, one end of the first connection pipe 23a is inserted into the upper tank 21b of the heat receiving portion 21 to be opened into the upper tank 21b, and the other end of the first connection pipe 23a is connected to a joint pipe 24 connected to the upper tank 22b of the heat radiating portion 22. On the other hand, one end of the second connection pipe 23b is inserted into the lower tank 22c of the heat radiating portion 22 to be opened in the lower tank 22c, and the other end of the second connection pipe 23b is connected to a joint pipe 25 connected to the lower tank 21c of the heat receiving portion 21. A pipe diameter of the first connection pipe 23a through which the refrigerant vapor flows may be larger than that of the second connection pipe 23b through which the condensed liquid refrigerant flows. Further, the upper tank 21b of the heat receiving portion 21 and the first connection pipe 23a may be connected through a joint pipe, and the lower tank 22c of the heat radiating portion 22 and the second connection pipe 23b may be connected through a joint pipe.

As shown in FIGS. 1 and 3, in the first embodiment, the panel cooler 4 includes two boiling units 6. Further, in both boiling units 6, the two heat receiving portions 21 and the two heat radiating portions 22 are crossed, and the first connection pipes 23a and the second connection pipes 23b are respectively disposed in cross shapes. As described above, in the first embodiment, both boiling units 6 together have two heat receiving portions 21 and two heat radiating portions 22. However, a plurality of the heat receiving portions 21 and a plurality of heat radiating portions 22 having the same number as the heat receiving portions 21 may be used. In this case, the heat receiving portions 21 and the heat radiating portions 22 are connected in such a manner that the most left-side heat receiving portion 21 is connected to the most right-side heat radiating portion 22, the second left-side heat receiving portion 21 is connected to the second right-side heat radiating portion 22, in this order, and the most right-side heat receiving portion 21 is connected to the most left-side heat radiating portion 22.

As shown in FIG. 1, the upper side blower unit 7 is disposed in the low-temperature-side heat transmission space 12 outside the heat radiating portion 22 of the boiling unit 6 (i.e., at a front side of the casing 5). Outside air (i.e., air outside the housing 3) is communicated with the low-temperature-side heat transmission space 12 through the outside air intake port 14 and the outside exhaust port 15.

The upper side blower unit 7 includes a turbo fan 7a which is a type of a centrifugal fan, an electric motor 7b for rotating and driving the turbo motor 7a, and a fan casing 7c forming an air blowing passage. Outside air sucked from a suction port 7d provided in the fan casing 7c is bent vertically and is blown out. The suction port 7d is provided to be opposite to the heat radiating portion 22 of the boiling unit 6. Outside air introduced from the outside air intake port 14 flows into a rear side of the heat radiating portion 22 through a space between the first connection pipe 23a and the second connection pipe 23b, and passes through the heat radiating portion 22 from the rear side toward the front side. Then, the outside air having passed through the heat radiating portion 22 passes through the fan casing 7c of the upper side blower unit 7, and is introduced into the outside air through exhaust port 15. The flow direction of the outside air is shown by an arrow A in FIG. 1.

The lower side blower unit 8 is disposed in the high-temperature-side heat transmission space 13 outside the heat receiving portion 21 of the boiling unit 6 (i.e., at a front side of the casing 5). Inside air (i.e., air inside the housing 3) circulates between the high-temperature-side heat transmission space 13 and the inner space 3A of the housing 3 through the inside air intake port 16 and the inside exhaust port 17. The lower side blower unit 8 includes a turbo fan 8a which is a type of a centrifugal fan, an electric motor 8b for rotating and driving the turbo motor 8a, and a fan casing 8c forming an air-blowing passage. Inside air sucked from a suction port 8d provided in the fan casing 8c is bent vertically and is blown out. The suction port 8d is provided to be opposite to the heat receiving portion 21 of the boiling unit 6. Inside air introduced from the inside air intake port 16 passes through the heat receiving portion 21, and is introduced into the inside air exhaust port 17 through the fan casing 8c of the lower side blower unit 8. The flow of the inside air is shown by an arrow B in FIG. 1.

The controller 9 electrically controls electric parts such as the electric motors 7b and 8b of the upper and lower side blower units 7 and 8 and an electric heater (not shown) based on the temperature within the housing 3. The temperature within the housing 3 is detected by a temperature sensor 27. As shown in FIG. 1, the temperature sensor 27 is disposed at an inner side (i.e., a side of the inside air introduction passage 20) of the inside air intake port 16 to detect the temperature of inside air introduced from the inside air intake port 16 and flowing through the inside air introduction passage 20.

The electric heater (not shown) is provided to prevent the performance of the electronic parts 2 from decreasing with lowering of the temperature within the housing 3. Thus, when the temperature within the housing 3 is lower than a predetermined lower limit temperature (e.g., 0), electric power is supplied to the electric heater to maintain the temperature within the housing 3 at a temperature more than the lower limit temperature.

The operation of the first embodiment is hereinafter explained.

When the inner temperature of the housing 3 is increased by heat generated from the electronic parts 2 and electric power is supplied to the electric motors 7b and 8b of the upper and lower side blower units 7 and 8, inside air circulates between the inner space 3A of the housing 3 and the high-temperature-side heat transmission space 13 by rotating the turbo fan 8a as shown by the arrow B in FIG. 1, and outside air flows through the low-temperature-side heat transmission space 12 by rotating the turbo fan 7a as shown by the arrow A in FIG. 1. Therefore, in the heat receiving portion 21 disposed within the low-temperature-side heat transmission space 13, the refrigerant sealed in each heat receiving pipe 21a boils and evaporates by receiving heat transmitted from inside air having a high temperature. The evaporated refrigerant vapor in each of the heat receiving pipes 21a rises upward, and flows into the heat radiating portion 22 through the upper tank 21b of the heat receiving portion 21 and the first connection pipe 23a.

The evaporated refrigerant vapor flowing into the upper tank 22b of the heat radiating portion 22 is distributed into each of the heat radiating pipes 22a from the upper tank 22b, and is condensed and liquified on the inner walls of the heat radiating pipes 22a. The condensed liquid refrigerant drops to the lower tank 22c along the inner walls of the heat radiating pipes 22a. The condensed liquid refrigerant in the lower tank of the heat radiating portion 22 flows into the lower tank 21c of the heat receiving portion 21 through the second connection pipe 23b, and is supplied to each of the heat receiving pipes 21a to repeat the above-described refrigerant cycle.

On the other hand, inside air flowing into the high-temperature-side heat transmission space 13 due to the operation of the lower side blower unit 8 is cooled by performing heat exchange between the inside air having a high temperature and the refrigerant sealed in the heat receiving pipes 21a of the heat receiving portion 21, and the cooled inside air flows from the inside air exhaust port 17 toward the inner space 3A of the housing 3 to cool the electronic parts 2.

Further, outside air flowing into the low-temperature-side heat transmission portion 12 due to the operation of the upper side blower unit 7 is heated while passing through the heat radiating portion 22, and is discharged from the outside air exhaust port 15 toward the outside of the housing 3.

By repeating the boiling and the condensation of the refrigerant circulating between the heat receiving portion 21 and the heat radiating portion 22, heat generated from the electronic parts 2 can be radiated to the outside of the housing 3 to cool the electronic parts 2 accommodated within the housing 3.

According to the first embodiment, the cooling device 1 includes two boiling units 6 having the two heat receiving portions 21 and the two heat radiating portions 22. The two heat radiating portions 22 are disposed at upper sides of the two heat receiving portions 21, and are connected to the heat receiving portions 21 to cross each other. Therefore, each of the first connection pipes 23a and the second connection pipes 23b for connecting the heat receiving portions 21 and the heat radiating portions 22 are formed in cross shapes. Further, the upper and lower side blower units 7 and 8 are disposed in such a manner that an air-blowing direction of the upper side blower unit 7 relative to the heat radiating portion 22 corresponds to an air-blowing direction of the lower side blower unit 7 relative to the heat receiving portion 21. That is, inside air and outside air respectively pass through the heat receiving portion 21 and the heat radiating portion 22 with the same flow directions. Thus, even when the heat receiving portions 21 and the heat radiating portions 22 are disposed in multiple steps (e.g., two steps in the first embodiment), a sufficient heat radiating performance can be obtained. To dispose the heat receiving portions 21 and the heat radiating portions 22 in the cross positions, only the first connection pipes 23a and the second connection pipes 23b are disposed in cross shapes. Therefore, the cooling device 1 is readily manufactured in low cost.

In the first embodiment, because the heat receiving portions 21 and the heat radiating portions 22 of the each boiling unit 6 are disposed in the cross positions, the upper and lower side blower units 7 and 8 can be disposed at one side of the boiling unit 6 so that the inside air and outside air can be blown with the same flow direction. Thus, it is compared with a case where the blower units 7 and 8 are respectively disposed at two sides of the boiling unit 6, the thickness of the panel cooler 4 can be reduced.

Further, the suction port 7d is provided in the upper side blower unit 7 to be opposite to the heat radiating portion 22, and the suction port 8d is provided to be opposite to the heat receiving portion 21. That is, each of the blower units 7 and 8 is a suction type blower. Therefore, pressure loss become small, consumption electric power for the blower units 7 and 8 can be reduced, air blowing noise can be reduced, and the sizes of the blower units 7 and 8 can be reduced. In the first embodiment, the flow of air is adjusted while passing through the heat radiating portion 22 and the heat receiving portion 21, and the upper and lower side blower units 7 and 8 suck the adjusted air having passed through the heat radiating portion 22 and heat receiving portion 21. Therefore, in the blower units 7 and 8, the fan effect can be improved and fan noise can be lowered. Thus, the distance between each of the blower units 7 and 8 and the boiling unit 6 can be reduced to reduce the thickness of the panel cooler 4.

Further, because the heat radiating portion 22 and the heat receiving portion 21 are respectively disposed to be opposite to the suction ports 7d and 8d of the blower units 7 and 8, the heat radiating portion 22 and the heat receiving portion 21 are used as protection nets for the suction ports 7d and 8d of the blower units 7 and 8. Therefore, they can prevent foreign substances from entering the suction ports 7d and 8d. Further, because each of the blower units 7 and 8 is the centrifugal type blower, air sucked from the suction ports 7d and 8d can be blown perpendicularly relative to the suction direction. Therefore, an air passage is effectively formed within the panel cooler 4 having a narrow space.

According to the first embodiment, within the low-temperature-side heat transmission space 12, the air passage 26 is provided in the space between the connection pipes 23 for connecting the heat receiving portion 21 and the heat radiating portion 22 of the boiling unit 6. Outside air sucked from the outside air intake port 14 is introduced into the rear side of the heat radiating portion 22 through the air passage 26. Therefore, it is not necessary to provide an air passage on the upper side of the heat radiating portion 22. A heat insulation member may be wound around the first connection pipe 23a and the second connection pipe 23b to interrupt heat transmission between outside air passing through the air passage 26 and refrigerant flowing within the first and second connection pipes 23a and 23b. Further, the heat insulation member may be wound around only the first connection pipe 23a through which gas refrigerant flows.

Further, after flowing into the rear side of the heat radiating portion 22 through the air passage 26, outside air passes through the heat radiating portion 22 while rising upward at the rear side of the heat radiating portion 22, and is sucked by the upper side blower unit 7. Therefore, even if dust, having a heavy weight, such as sand flows from the outside air intake port 14 with outside air, the dust falls when outside air rises upward at the rear side of the heat radiating portion 22, thereby preventing dust from adhering to the heat radiating portion 22.

According to the first embodiment, the inside air intake port 16 for introducing inside air of the housing 3 into the high-temperature-side heat transmission space 13 is opened toward the upper side of the casing 5 at the rear side of the casing 5, and the inside air exhaust port 17 through which inside air having passed through the heat receiving portion 21 flows into the inner space of the housing 3A are opened toward the lower side of the casing 5. Because inside air having a high temperature is introduced from the upper side of the casing 5 and inside air having a low temperature is discharged from the lower side of the casing 5, the inside air effectively circulates within the housing to effectively cool the electronic parts 2.

Further, outside air of the housing 3 is introduced into the low-temperature-side heat transmission space 12 from the outside air intake port 14, the outside air is heated while passing through the heat radiating portion 22, and the heated outside air is discharged from the outside air exhaust port 15. Because the outside air exhaust port 15 is provided at the upper position as compared with the outside air intake port 14, outside air having a low temperature is introduced from a lower side of the housing 3 and outside air having a high temperature is discharged from an upper side of the housing 3. In this case, since the buoyancy of outside air can be used, a load of the upper side blower unit 7 can be reduced.

According to the first embodiment, because the upper and lower side blower units 7 and 8 are disposed outside the heat radiating portion 22 and the heat receiving portion 21, heat generated by the electric motors 7b and 8b can be transmitted into motor cases 7c and 8c to which the electric motors 7b and 8b are attached, and is further transmitted into outside air. Therefore, as compared with a case where the upper and lower side blower units 7 and 8 are disposed inside the panel cooler 4, the electronic parts 2 within the housing 3 can be effectively cooled without increasing the cooling performance of the boiling unit 6. Further, because the upper and lower side blower units 7 and 8 are disposed outside the boiling unit 6, the maintenance and replacement for the blower units 7 and 8 can be readily performed by only opening the maintenance hatches 18 and 19.

A second preferred embodiment of the present invention will be described with reference to FIG. 4.

Figure 4:
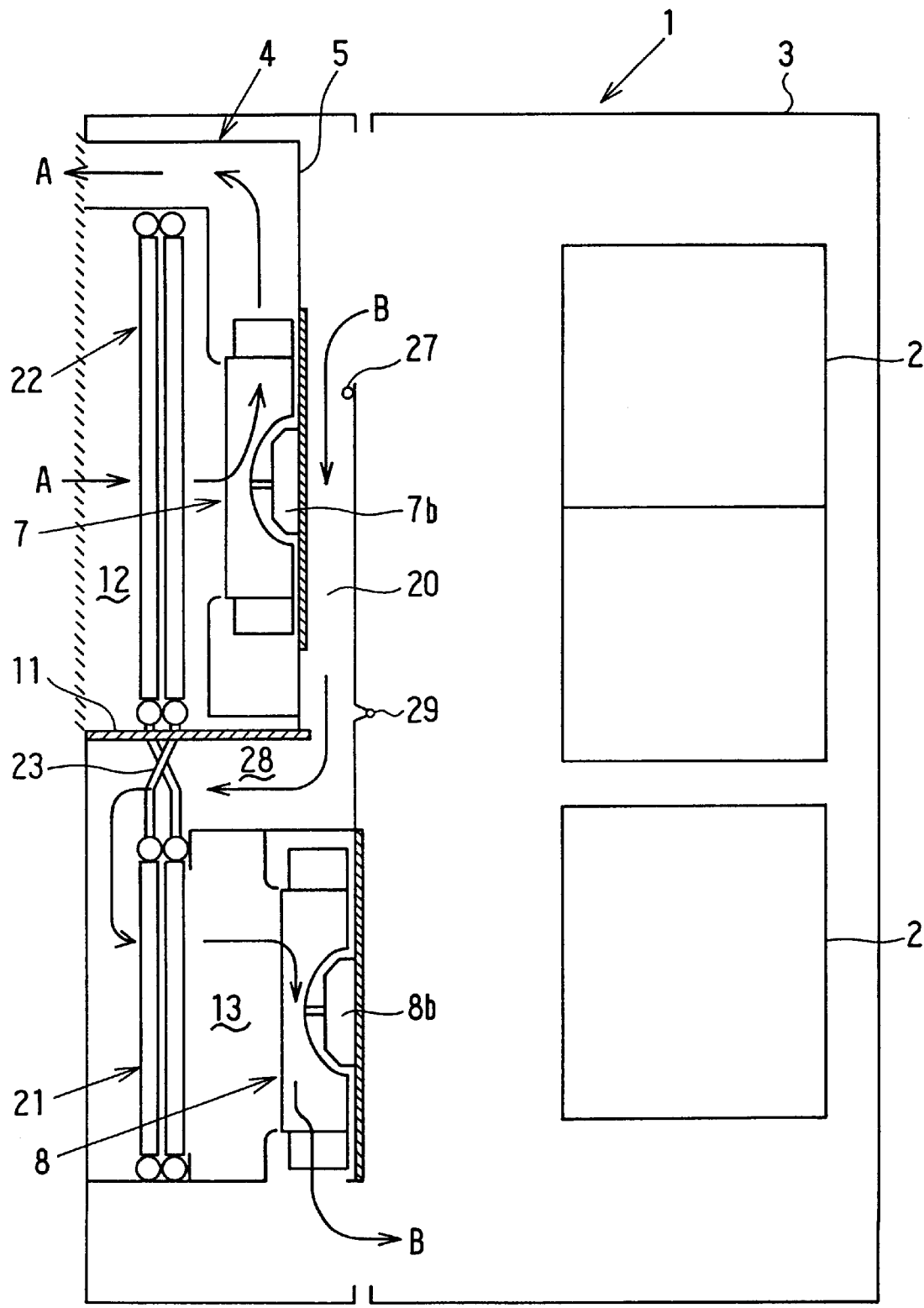
FIG. 4 is a schematic cross-sectional view showing a cooling device according to a second preferred embodiment of the present invention.

In the second embodiment, a panel cooler 4 has a supporting shaft (not shown) at one end side, and the panel cooler 4 is attached to the housing 3 such that it can rotate around the supporting shaft, as shown in FIG. 4. Further, the upper and lower side blower units 7 and 8 are disposed at the inner side (i.e., the right side in FIG. 4) of the boiling unit 6. In this case, the pipe space of the connection pipe 23 is provided on the lower side of the partition plate 11, and an air passage 28 through which inside air of the housing 3 flows can be provided using the pipe space of the connection pipe 23.

Further, relative to the housing 3, the whole panel cooler 4 is rotatable around the supporting shaft. Therefore, the maintenance and change for the upper and lower side blower units 7 and 8 can be readily performed. In this case, main parts such as the electric motors 7b and 8b can be provided inside the panel cooler 4. In the second embodiment, a hinge 29 is provided on the rear surface of the casing 5, and an upper portion of the casing 5 is movably disposed using the hinge 29. Therefore, the maintenance performance and change performance for the upper side blower unit 7 can be further improved.

A third preferred embodiment of the present invention will be described with reference to FIG. 5.

Figure 5:
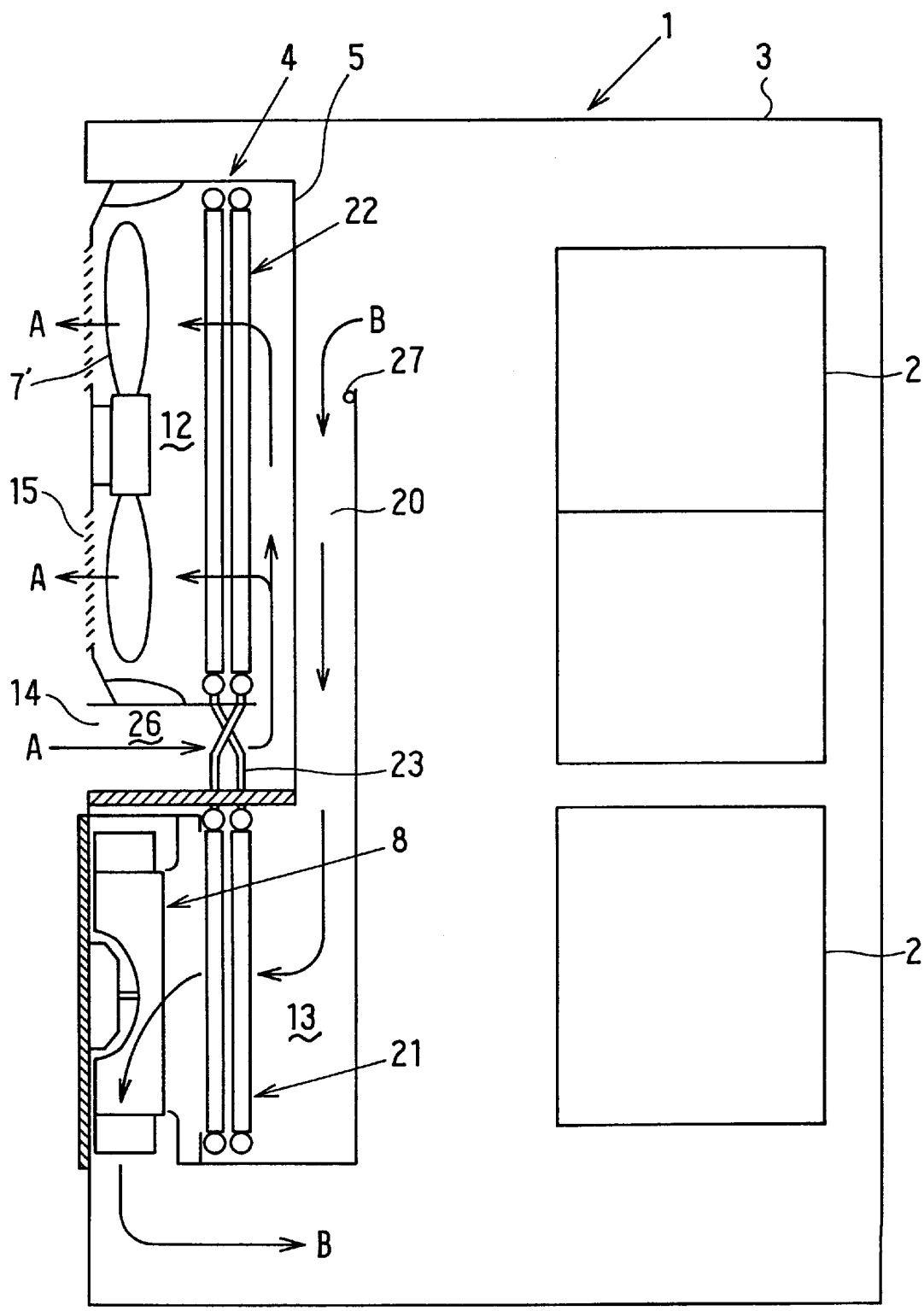
FIG. 5 is a schematic cross-sectional view showing a cooling device according to a third preferred embodiment of the present invention.

As shown in FIG. 5, in the third embodiment, an axial flow type fan 7' is used as the upper side blower unit 7 in the first embodiment. The outside air exhaust port 15 is provided on a front surface of the axial flow type fan 7', and the outside air intake port 14 is provided at a lower side of the outside air exhaust port 15. The flow of outside air blown by the axial flow type fan 7' is shown by an arrow A in FIG. 5. That is, outside air introduced from the outside air intake port 14 flows into the rear side of the heat radiating portion 22 through the air passage 26, and passes through the heat radiating portion 22. The outside air having passed through the heat radiating portion 22 is sucked into the axial flow type fan 7', and is discharged from the outside air exhaust port 15. In the third embodiment, because the axial flow type fan 7' is disposed within the low-temperature-side heat transmission space 12 opposite to the outside air exhaust port 15, it is not necessary to bend the flow of air blown from the axial flow fan 7'.

Further, the heat radiating portion 22 is disposed at a suction side of the axial flow fan 7'. Therefore, air having small velocity distribution in the radial direction of the axial flow fan 7' is blown toward the heat radiating portion 22, and the performance of the heat radiating portion 22 can be improved.

A fourth preferred embodiment of the present invention will be described with reference to FIG. 6.

Figure 6:
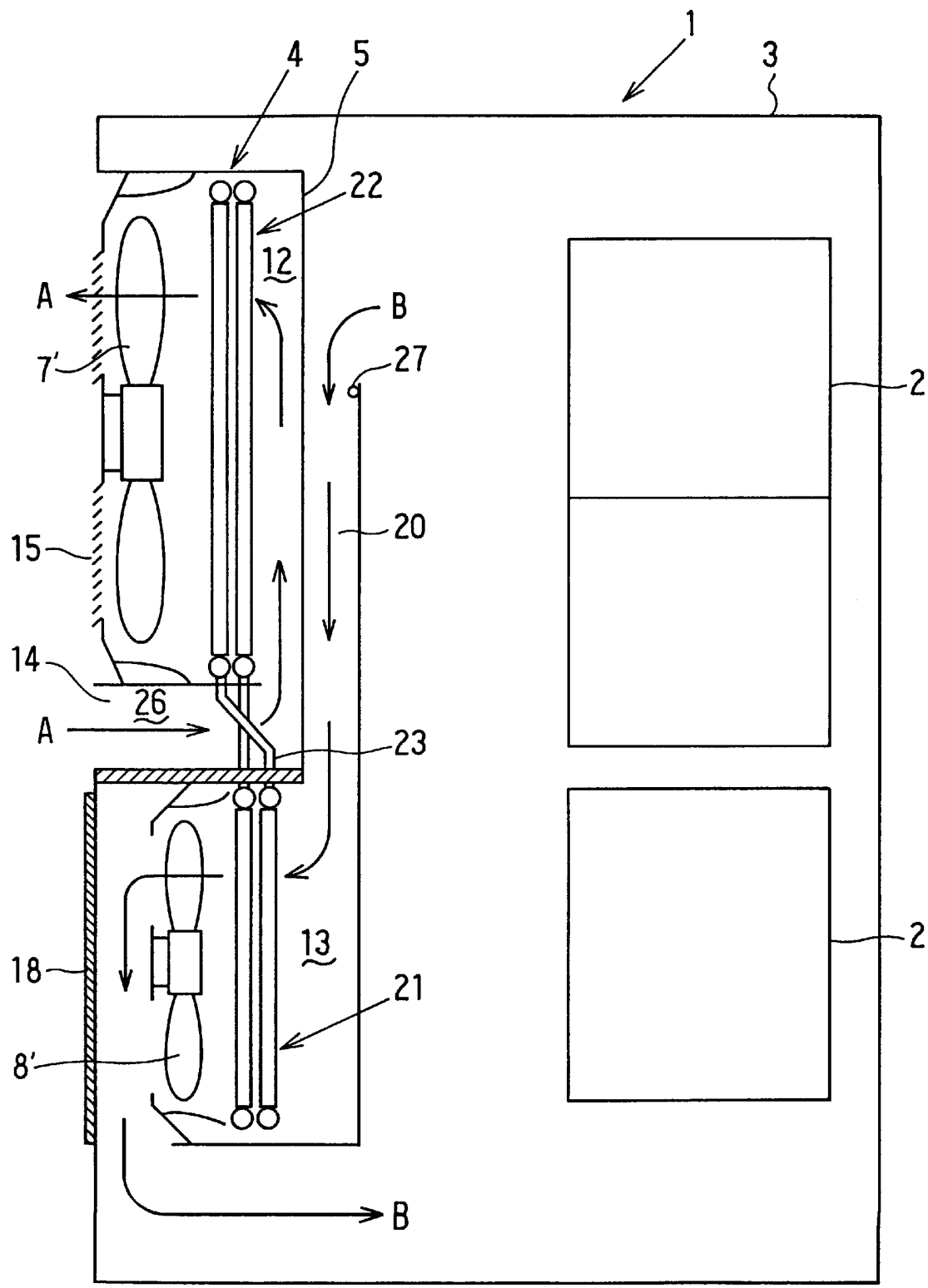
FIG. 6 is a schematic cross-sectional view showing a cooling device according to a fourth preferred embodiment of the present invention.

As shown in FIG. 6, in the fourth embodiment, both of axial flow type fans 7' and 8' are used as the upper and lower side blower units 7 and 8 in the first embodiment. In the fourth embodiment, the front side of the high-temperature-side heat transmission space 13 is closed by a maintenance hatch 18. It is necessary to vertically bend air blown from the axial flow type fan 8'. Therefore, in this case, preferably, a distance between the axial flow fan 8' and the maintenance hatch 18 is made as large as possible to reduce the pressure loss. However, when the distance between the axial flow fan 8' and the maintenance hatch 18 is increased, the width (i.e., the dimension in the left-right direction in FIG. 6) of the panel cooler 4 also increases. Thus, in the fourth embodiment, the heat receiving portion 21 is shifted from the heat radiating portion 22 to the rear side (i.e., the right side in FIG. 6) as shown in FIG. 6. As a result, the distance between axial flow type fan 8' and the maintenance hatch 18 is made larger by the shifted amount of the heat receiving portion 21.

Figure 7:
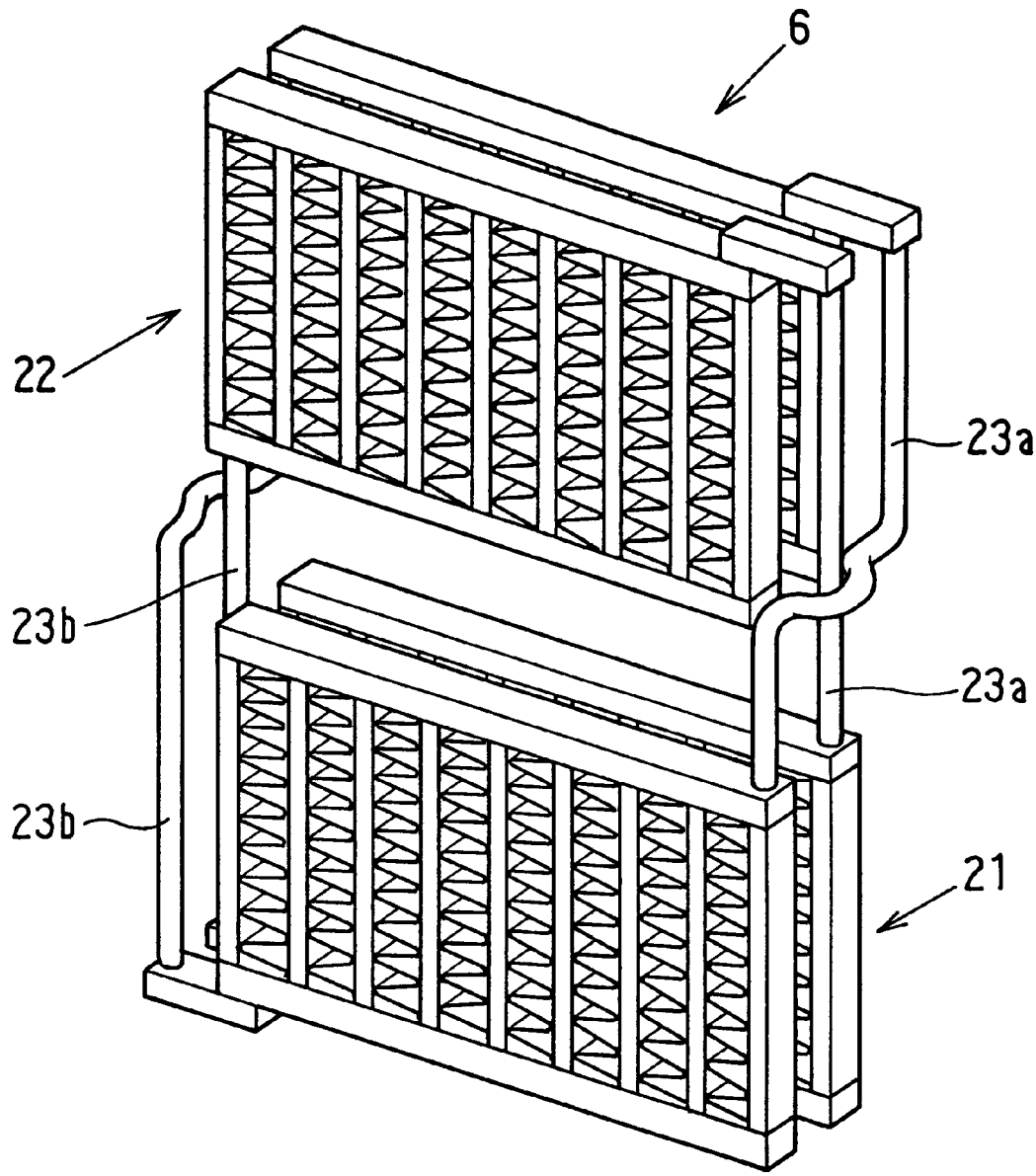
FIG. 7 is a perspective view showing a boiling unit according to the fourth embodiment.

As shown in FIG. 7, in both boiling units 6, one of the heat radiating portions 22 and one of the heat receiving portions 21 are disposed in series in an up-down direction in FIG. 7, and the two portions 21 and 22 disposed in series can be connected using straight connection pipes 23a and 23b. Therefore, the boiling unit 6 is readily manufactured at a low cost.

A fifth preferred embodiment of the present invention will be now described with reference to FIG. 8.

Figure 8:
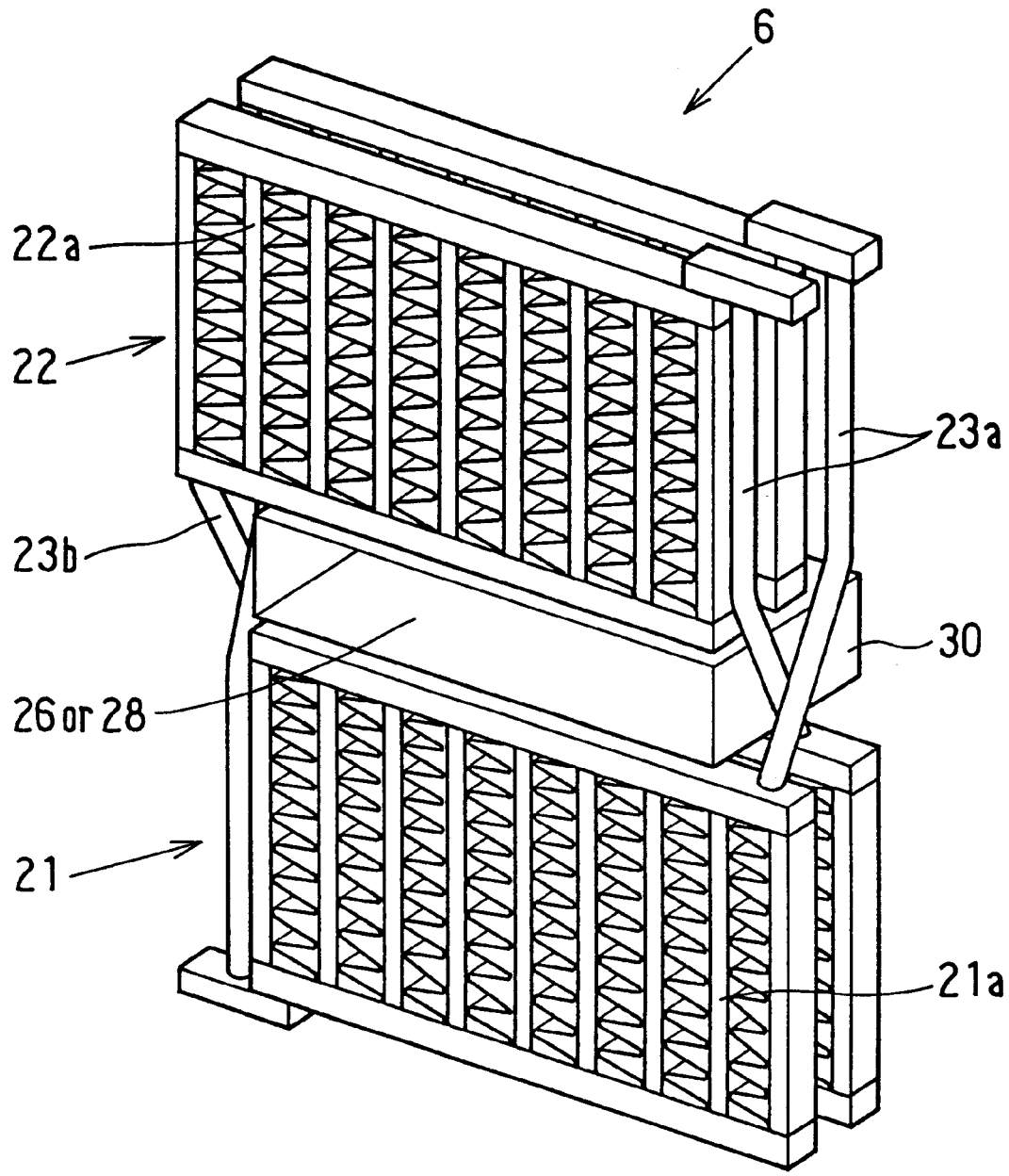
FIG. 8 a perspective view showing a boiling unit according to a fifth preferred embodiment of the present invention.

As shown in FIG. 8, in the fifth embodiment, the air passage 26 or the air passage 28 between the first and second connection pipes 23a and 23b is provided with a duct 30. Therefore, heat transmission between air flowing through the duct 30 and refrigerant flowing through the connection pipe 23 can be interrupted. When outside air flows through the duct 30, gas refrigerant flowing through the first connection pipe 23a is not condensed by the outside air in the duct 30. Further, when inside air of the housing 3 flows through the duct 30, condensed liquid refrigerant flowing through the second connection pipe 23b is not evaporated by the inside air in the duct 30.

Figure 9:
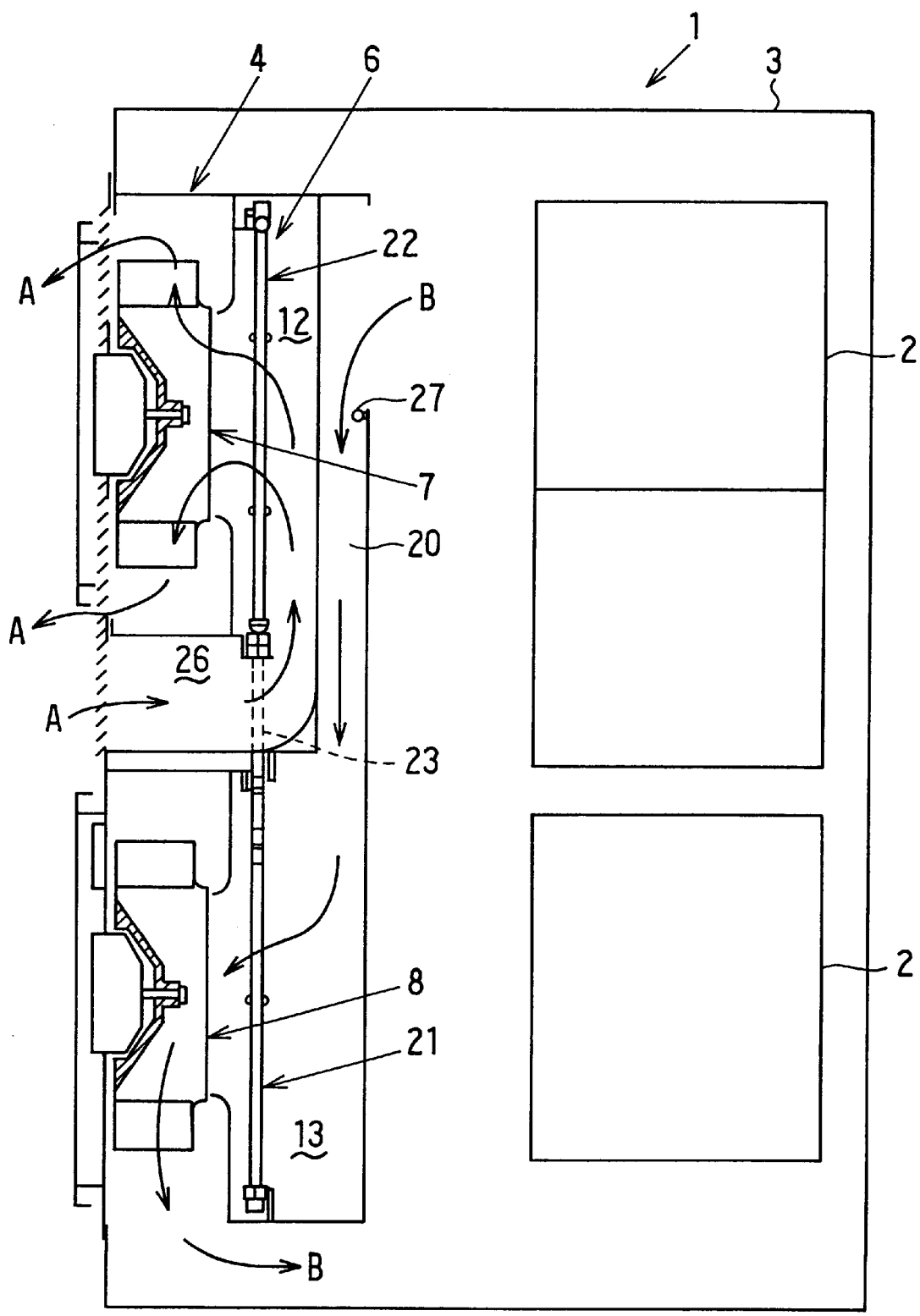
FIG. 9 is a schematic cross-sectional view showing a cooling device according to a modified embodiment of the present invention.

In each of the above-described embodiments, both boiling units 6 are used. However, as shown in FIG. 9, a single boiling unit 6 may be used.

A sixth preferred embodiment of the present invention will be described with reference to FIGS. 10 through 14B.

Figure 10:
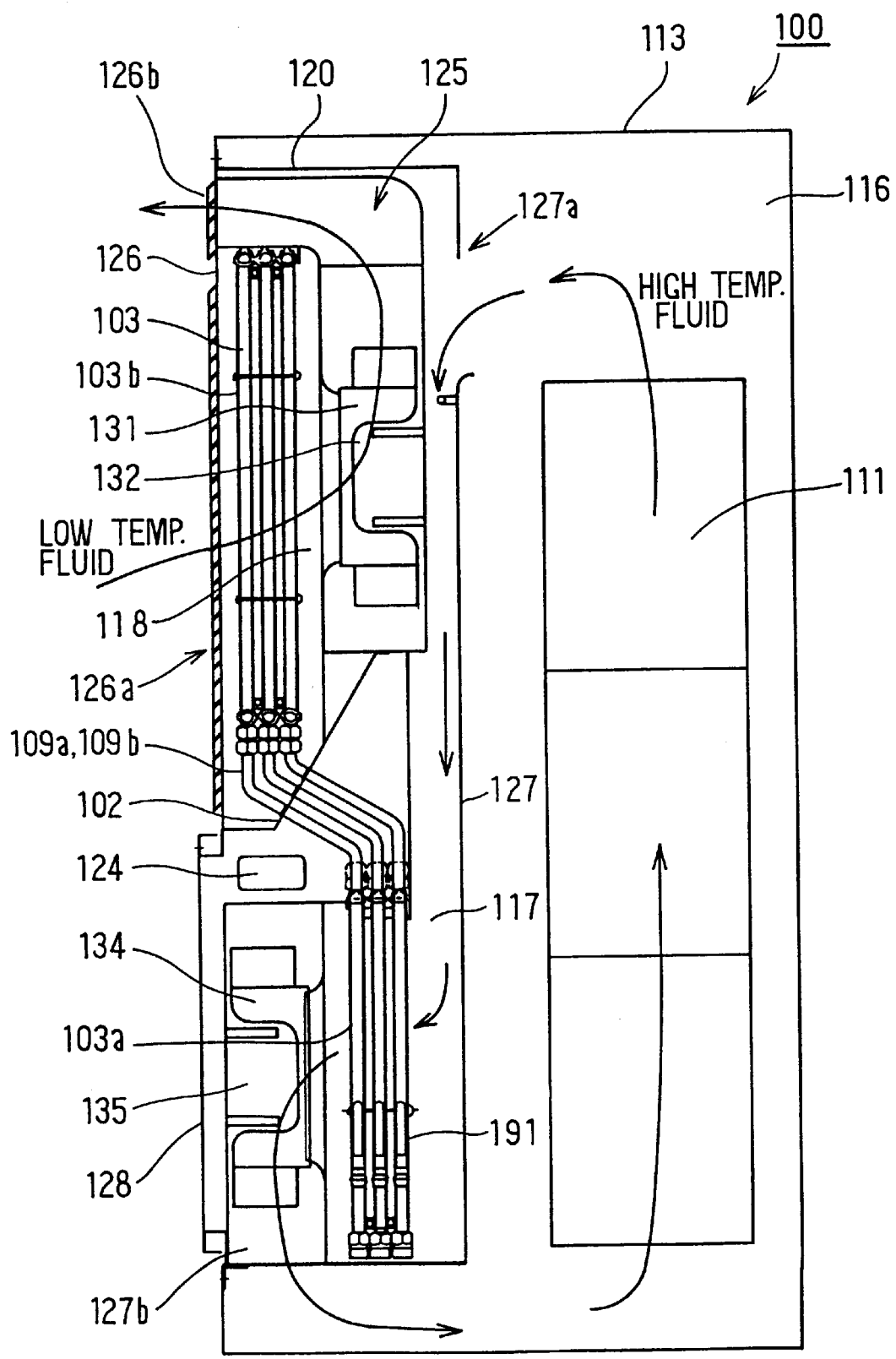
FIG. 10 is a schematic diagram showing a cooling device according to a sixth preferred embodiment of the present invention.
Figure 11:
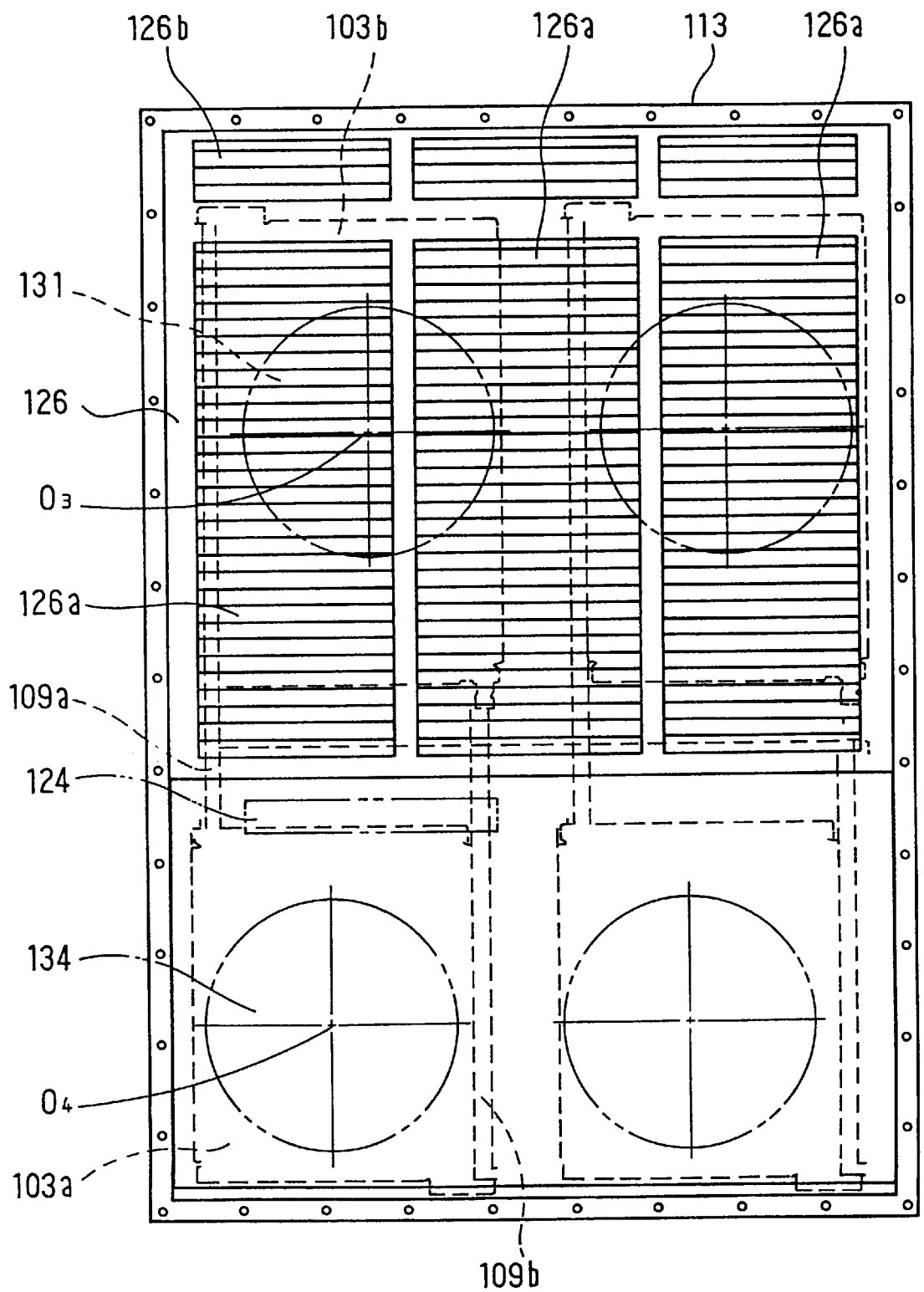
FIG. 11 is a front view of the cooling device when viewed from a left side in FIG. 10.

A box-shaped cooling device 100 can be applied to a radio base station device of a mobile radio telephone such as a pocket telephone and a vehicle telephone. As shown in FIGS. 10 and 11, the cooling device 100 includes a housing 103 for hermetically accommodating electric parts 111, and a panel cooler 125 for cooling the electronic parts 111. The panel cooler 125 includes a boiling unit 103, an upper side blower unit 131 and a lower side blower unit 134.

The electronic parts 111 are a heat-generating member which perform an electronic operation and generate heat when an electric power is applied thereto. For example, the electronic parts 111 are a semiconductor switching element forming a high-frequency switching circuit installed in a transceiver, or a power transistor installed in a power amplifier.

The housing 113 is formed in a box-shape to form a hermetical inner space 116. The inner space 116 is air-tightly partitioned by a fluid partition plate 102 of the panel cooler 125 to prevent the performance of the electronic parts 111 from being reduced by a foreign object such as dust and water.

Further, the inner space 116 is partitioned with a high-temperature-side heat transmission space 117 of the panel cooler 125 by a rear side partition plate 127 of a casing 120. In the high-temperature-side heat transmission space 117, an area of an air passage at an upstream air side is made narrower than that at a downstream air side.

The panel cooler 125 includes: the casing 120 formed integrally with the housing 113; the fluid partition plate 102 for partitioning an interior of the casing 120 into the high-temperature-side heat transmission space 117 and a low-temperature-side heat transmission space 118; the boiling unit 103 for decreasing the temperature in the inner space 116 to be lower than an upper limit temperature (e.g., 70); two upper side blower units 131, disposed in the low-temperature-side heat transmission space 118, for blowing outside air having a low temperature (i.e., air outside the housing 113, low-temperature fluid); two lower side blower units 134, disposed in the high-temperature-side heat transmission space 117, for blowing inside air having a high temperature (i.e., air inside the housing 113, high-temperature fluid); an electric heater (not shown) for maintaining the temperature of air within the inner space 116 to be more than a lower limit temperature (e.g., 0); and a controller 124 for electrically controlling the upper and lower side blower units 131 and 134 and the electric heater.

The casing 120 includes: the rear side partition plate 127 for partitioning the inner space 116 and the high-temperature-side heat transmission space 117; a high-temperature-side intake port 127a opened at an upper side of the rear side partition plate 127; a high-temperature-side exhaust port 127b opened at a lower side of the rear side partition plate 127; an outer wall plate 126 disposed outside the boiling unit 103 (i.e., the most left side in FIG. 10); a low-temperature-side intake port 126a opened at a lower side of the outer wall plate 126; a low-temperature-side exhaust port 126b opened at an upper side of the outer wall plate 126; and a maintenance hatch 128 detachably disposed at a lower side of the low-temperature-side intake port 126a. The outer wall plate 126 and the rear side partition plate 127 are fixed to the housing 113 using a melding method or a fastening method.

The fluid partition plate 102 is made of a thin metal plate. The fluid partition plate 102 is air-tightly connected to the boiling unit 103 and the casing 120 to hermetically partition the inner space 116 including the high-temperature-side space 117 from the outside including the low-temperature-side heat transmission space 118. Further, the fluid partition plate 102 is disposed obliquely relative to the rear side partition plate 127, a heat receiving portion 103a, a heat radiating portion 103b, the lower side blower units 134 and the upper side blower units 131. In the fluid partition plate 102, a plurality of through holes for allowing the penetration of connection pipes 109a and 109b described later are opened. A resin member made of rubber or the like may be positioned between the fluid partition plate 102 and each of the connection pipes 109a and 109b to suppress heat transmission therebetween. Further, a heat insulation member may be wound around the fluid partition plate 102.

Next, the boiling unit 103 of the sixth embodiment will be described with reference to FIGS. 12 and 13.

Figure 12:
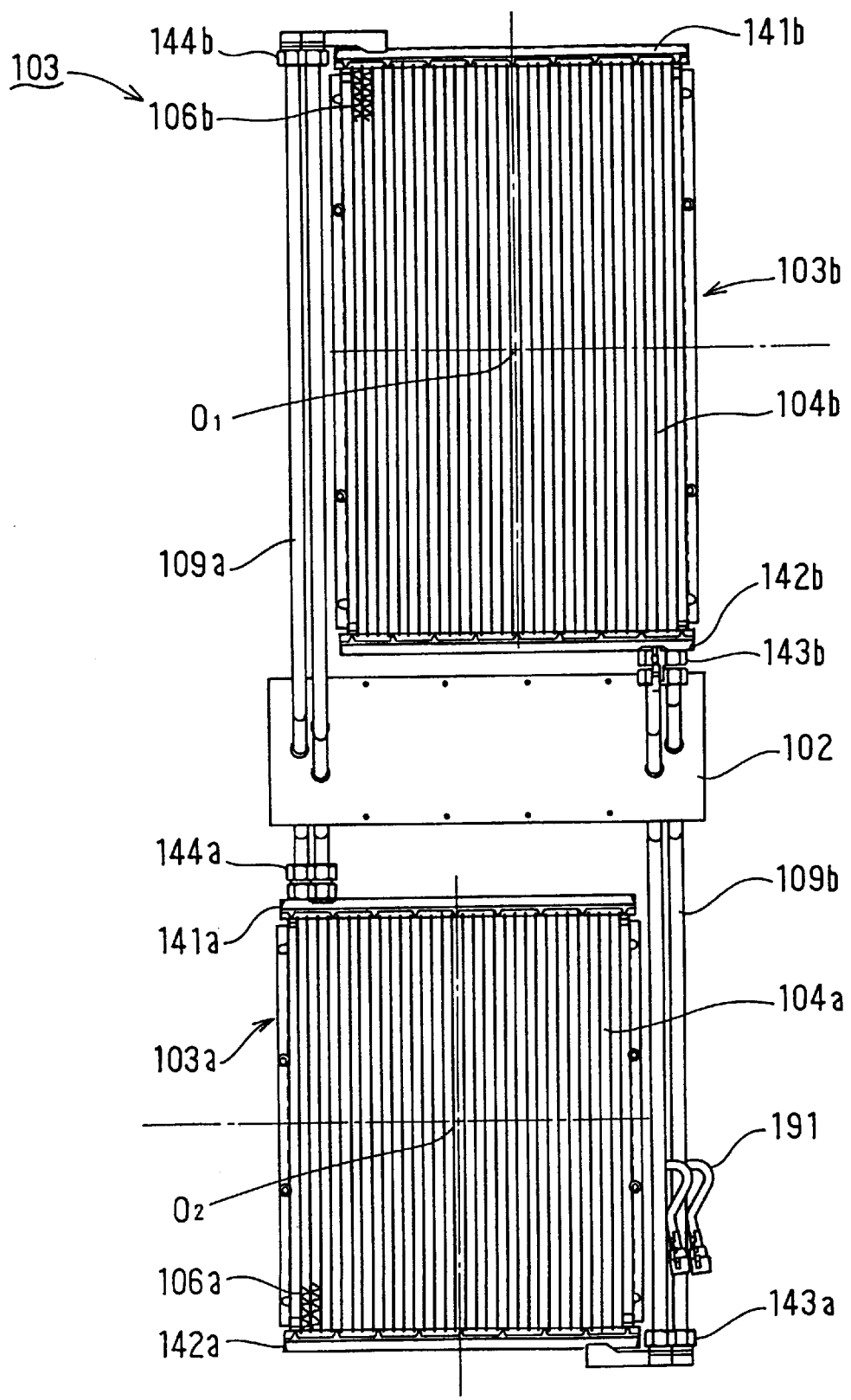
FIG. 12 is a front view of a boiling unit according to the sixth embodiment.
Figure 13:
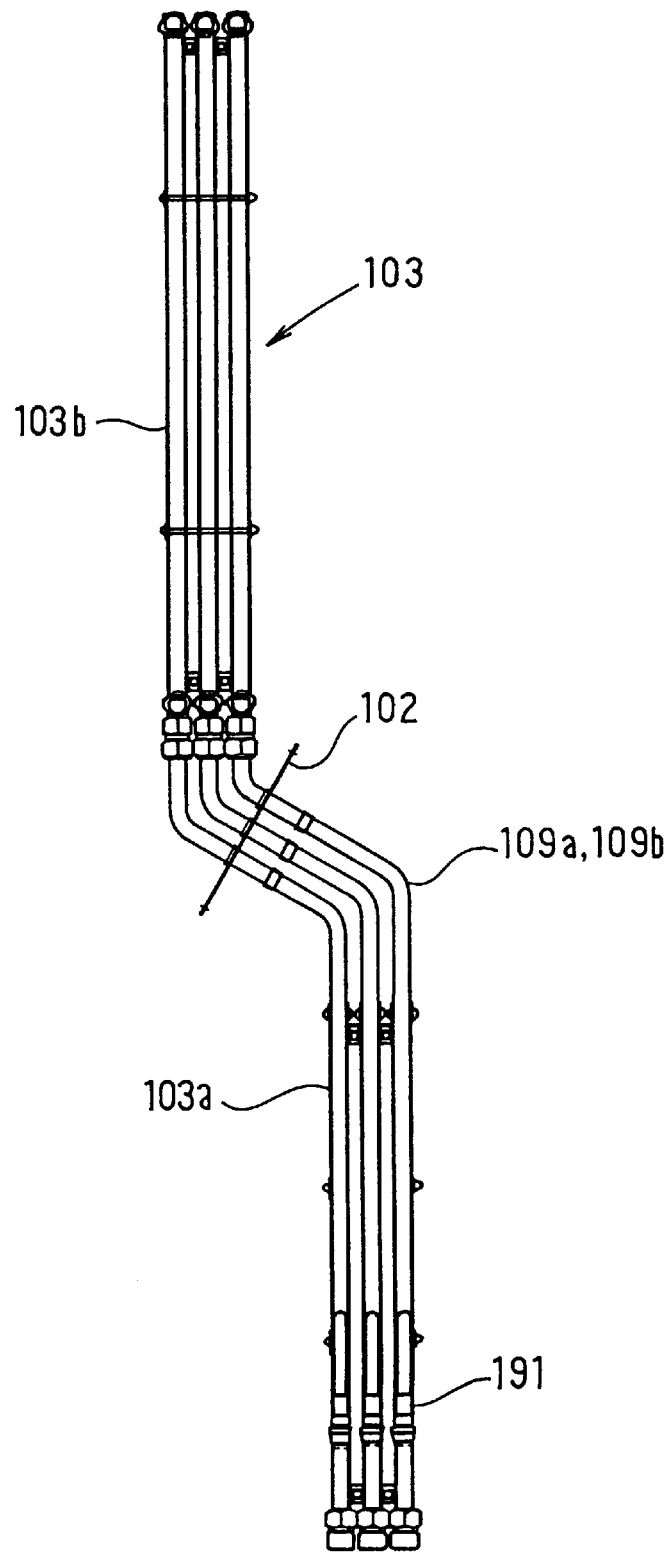
FIG. 13 is a side view of the boiling unit in FIG. 12.

As shown in FIGS. 12 and 13, the connection pipes 109a and 109b penetrate through the fluid partition plate 102. In the sixth embodiment, three boiling units 103 are laminated in the flow directions of inside air and outside air. Since each of the three boiling units 103 has the same structure, the structure of a single boiling unit 103 will be described. The boiling unit 103 includes: the heat receiving portion 103a having a plurality of heat receiving pipes 104a disposed at the high-temperature fluid side relative to the fluid partition plate 102; the heat radiating portion 103*b* having a plurality of heat radiating pipes 104*b* disposed at the low temperature fluid side relative to the fluid partition plate 102; and the connection pipes 109*a* and 109*b* for air-tightly connecting the heat receiving portion 103*a* and the heat radiating portion 103*b*. Further, heat transmission fins 106*a* are disposed between adjacent heat receiving pipes 104*a*, and heat transmission fins 106*b* are disposed between adjacent heat radiating pipes 104*b*.

The heat receiving portion 103*a* is disposed at a lower side of the heat radiating portion 103*b* and is shifted from the heat radiating portion 103*b* to the side of the upper side blower unit 134 (i.e., the right side in FIG. 10) in a lateral direction in FIG. 10. The plurality of heat receiving pipes 104*a* are disposed on a planar surface which is approximately parallel to the rear side partition plate 127. The heat receiving portion 103*a* further includes a high-temperature-side lower tank 142*a* disposed at the lower end of the heat receiving pipes 104*a*, and a high-temperature-side upper tank 141*a* disposed at the upper end of the heat receiving pipes 104*a*. Each of the heat receiving pipes 104*a* is made of metal having a sufficient heat transmitting performance such as aluminum or copper, and is formed in a flat shape having an elliptical shape or a rectangular shape.

Within each of the heat receiving pipes 104*a*, a plurality of inner partition plates are formed in an up-down direction. By the plurality of the inner partition plates, the inner side of each heat receiving pipe 104*a* is partitioned into a plurality of portions. That is, each heat receiving pipe 104*a* includes two opposite flat walls and a plurality of inner plate members integrated with the two flat walls. Therefore, in the heat receiving pipes 104*a*, the heat receiving performance is improved.

The heat radiating portion 103*b* is disposed at an upper side of the heat receiving portion 103*a*, and is shifted from the heat receiving portion 103*a* to the side of the lower side blower unit 134 (i.e., the left side in FIG. 1) in the lateral direction in FIG. 10. Similarly to the heat receiving portion 103*a*, the heat radiating portion 103*b* includes: a plurality of heat radiating pipes 104*b* disposed on a planar surface which is approximately parallel to the rear side partition plate 127; a low-temperature-side lower tank 142*b* connected to each lower end of the heat radiating pipes 104*b*; and a low-temperature-side upper tank 141*b* connected to each upper end of the heat radiating pipes 104*b*.

Each of the heat radiating pipes 104*b* is made of metal having a sufficient heat transmitting performance such as aluminum or copper, and is formed in a flat shape having an elliptical shape or a rectangular shape. Similarly to the heat receiving pipes 104*a*, a plurality of inner partition plates are integrally formed within each heat radiating pipes 104*b* in the up-down direction to increase the heat radiating performance of the heat radiating portion 103*b*.

The high-temperature-side connection pipe 109*a* (i.e., first connection pipe) is communicated with the upper tank 141*a* of the heat receiving portion 103*a* and the upper tank 141*b* of the heat radiating portion 103*b* as shown in FIG. 12. Therefore, boiled and evaporated refrigerant in the heat receiving portion 103*a* is supplied to the heat radiating portion 103*b* through the high-temperature-side connection pipe 109*a*. The connection pipe 109*a* is bent from the heat receiving portion 103*a* toward the heat radiating portion 103*b* to have a first bent portion between the fluid partition plate 102 and the upper tank 141*a* of the heat receiving portion 103*a*, and is also bent from the heat radiating portion 103*b* toward the heat receiving portion 103*a* to have a second bent portion between the fluid partition plate 102 and the upper tank 141*b* of the heat radiating portion 103*b*. Between the first and second bent portions, the high-temperature-side connection pipe 109*a* is approximately perpendicular to the fluid partition plate 102. The connection pipe 109*a* has connection pipe portions disposed approximately in parallel with the heat receiving pipes 104*a*. Preferably, the distance between adjacent connection pipe portions of the connection pipe 109*a* is made larger than that between adjacent heat receiving pipes 104*a*. More preferably, the distance between adjacent connection pipe portions of the connection pipe 109*a* is made larger than twice the distance between adjacent heat receiving pipes 104*a*.

The low-temperature-side connection pipe 109*b* (i.e., second connection pipe) is communicated with the high-temperature-side lower tank 142*a* of the heat receiving portion 103*a* and the low-temperature-side lower tank 142*b* of the heat radiating portion 103*b*. Therefore, condensed refrigerant in the heat radiating portion 103*b* returns to the heat receiving portion 103*a* through the connection pipe 109*b*. The connection pipe 109*b* is bent from the heat receiving portion 103*a* toward the heat radiating portion 103*b* to have a first bent portion between the fluid partition plate 102 and the lower tank 142*a* of the heat receiving portion 103*a*, and is also bent from the heat radiating portion 103*b* toward the heat receiving portion 103*a* to have a second bent portion between the fluid partition plate 102 and the lower tank 142*b* of the heat radiating portion 103*b*. Between the first and second bent portions, the low-temperature-side connection pipe 109*b* is approximately perpendicular to the fluid partition plate 102. The connection pipe 109*b* has connection pipe portions disposed approximately in parallel with the heat radiating pipes 104*b*. Preferably, the distance between adjacent connection pipe portions of the connection pipe 109*b* is made larger than that between each adjacent radiating pipes 104*b*. More preferably, the distance between adjacent connection pipe portions of the connection pipe 109*b* is made larger than twice of the distance between adjacent the heat receiving pipes 104*b*.

Tubes 191 are connected respectively to each connection pipe portion of the connection tube 109*b* at a lower portion of the connection tube 109*b*. That is, the tubes 191 are connected to the connection tube 109*b* at a position lower than a refrigerant surface when the boiling unit 103 is not operated, preferably, at a position lower than a center O2 of the heat receiving portion 103*a*. The refrigerant is introduced into the heat receiving portion 103*a* through the tubes 191, and the tubes 191 are used for reducing the pressure within the boiling unit 103.

In the sixth embodiment, the total number of the connection pipe portions of the high-temperature-side connection pipe 109*a* and the low-temperature-side connection pipe 109*b* is set to be smaller than any one of number of the heat receiving pipes 104*a* of the heat receiving portion 103*a* and number of the heat radiating pipes 104*b* of the heat radiating portion 103*b*. Further, the total cross sectional area of the high-temperature-side connection pipes 109*a* and the low-temperature-side connection pipes 109*b* in radial direction is set to be smaller than either one of the total cross sectional area of the heat receiving pipes 104*a* of the heat receiving portion 103*a* or the total cross sectional area of the heat radiating pipes 104*b* of the heat radiating portion 103*a*.

Further, the lateral width of the heat receiving portion 103*a* in the laminated direction of the heat receiving pipes 104a is similar to the lateral width of the heat radiating portion 103b in the laminated direction of the heat radiating pipes 104b. The heat receiving portion 103a and the heat radiating portion 103b are shifted relative to each other in the lateral width direction. Therefore, shifted portions are formed between the heat receiving portion 103a and the heat radiating portion 103b in the lateral width direction thereof. The high-temperature-side connection pipe 109a and the low-temperature-side connection pipe 109b are disposed in the shifted portion in the lateral width direction.

As the refrigerant, $CH_2FCF_3$ or water may be used. Further, as the refrigerant, mixed refrigerant or a single refrigerant may be used. A liquid refrigerant is sealed within the boiling unit 103 to a level approximately corresponding to the fluid partition plate 102 when the boiling unit 103 is not operated, so that the liquid refrigerant does not reach the heat radiating pipes 104b when the boiling unit 103 is operated. After brazing the heat transmission fins 106a and 106b to each of the heat receiving pipes 104a and the heat radiating pipes 104b, the liquid refrigerant is sealed within the heat receiving pipes 104a.

Each of the heat transmission fins 106a is disposed between adjacent heat receiving pipes 104a, and each of the heat transmission fins 106b is disposed between adjacent heat radiating pipes 104b. Each of the heat transmission fins 106a and 106b is a corrugated fin made of a thin plate formed into a wave shape by folding the thin plate in alternate direction. A thickness of the thin plate is in a range of 0.02–0.05 mm.

Each of the heat transmission fins 106a and 106b is brazed to each outer wall surface of the heat receiving pipes 104a and heat radiating pipes 104b. By the heat transmission fins 106a and 106b, heat is readily transmitted between fluid (i.e., air) and the refrigerant, and strength of the heat receiving pipes 104a and the heat radiating pipes 104b can be improved.

The fin pitch P1 of the heat transmission fins 106a disposed in the heat receiving portion 103a can be set in a range of 1.50–2.90 mm. Preferably, the fin pitch P1 of the heat transmission fins 106a is in a range of 2.00–2.50 mm. In the sixth embodiment, the fin pitch P1 of the heat transmission fins 106a is 2.40 mm. The fin pitch P2 of the heat transmission fins 106b disposed in the heat radiating portion 103b can be set in a range of 3.00–4.50 mm. Preferably, the fin pitch P2 of the heat transmission fins 106b is in a range of 3.50–4.00 mm. In the sixth embodiment, the fin pitch P2 of the heat transmission fins 106b is 3.75 mm. That is, the fin pitch P1 of the heat transmission fins 106a is smaller than the fin pitch P2 of the heat radiating fins 106b by 50%–65%.

As shown in FIG. 10, high-temperature inside air (i.e., inside air inside the housing 113) circulates in the high-temperature-side heat transmission space 17 of the inner space 116, and low-temperature outside air (i.e., outside air outside the housing 113) flows through the low-temperature-side heat transmission space 118. In the sixth embodiment, the flow direction of inside air passing through the heat receiving portion 103a is opposite to the flow direction of outside air passing through the heat radiating portion 103b. In the flow directions of inside air and outside air, a plurality of boiling units 103 (e.g., three boiling units in the sixth embodiment) are disposed.

Figure 14A:
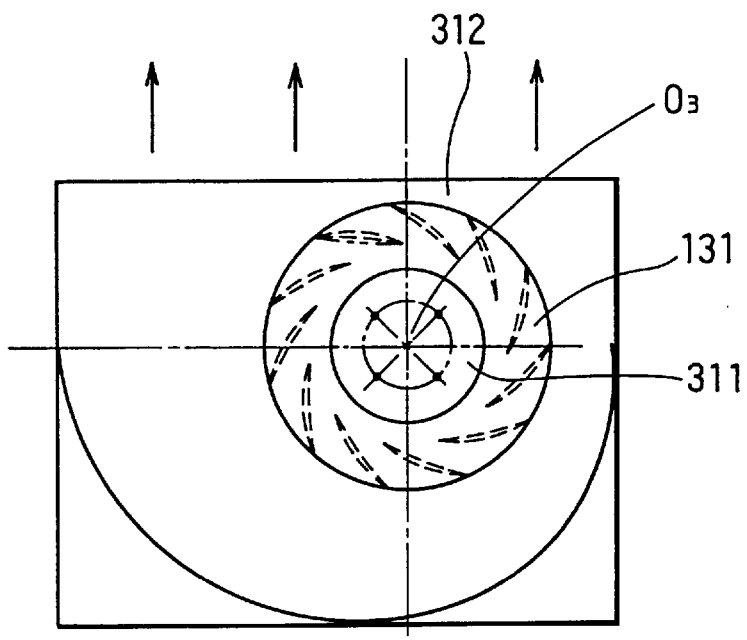
FIG. 14A is a front view showing a turbo fan of a blower unit of the cooling device according to the sixth embodiment.
Figure 14B:
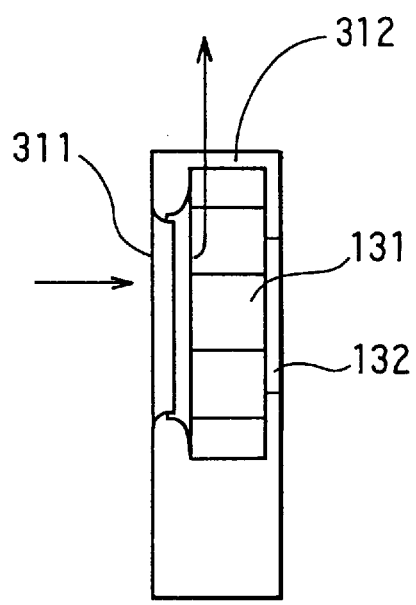
FIG. 14B is side view of the turbo fan in FIG. 14A.
Figure 15:
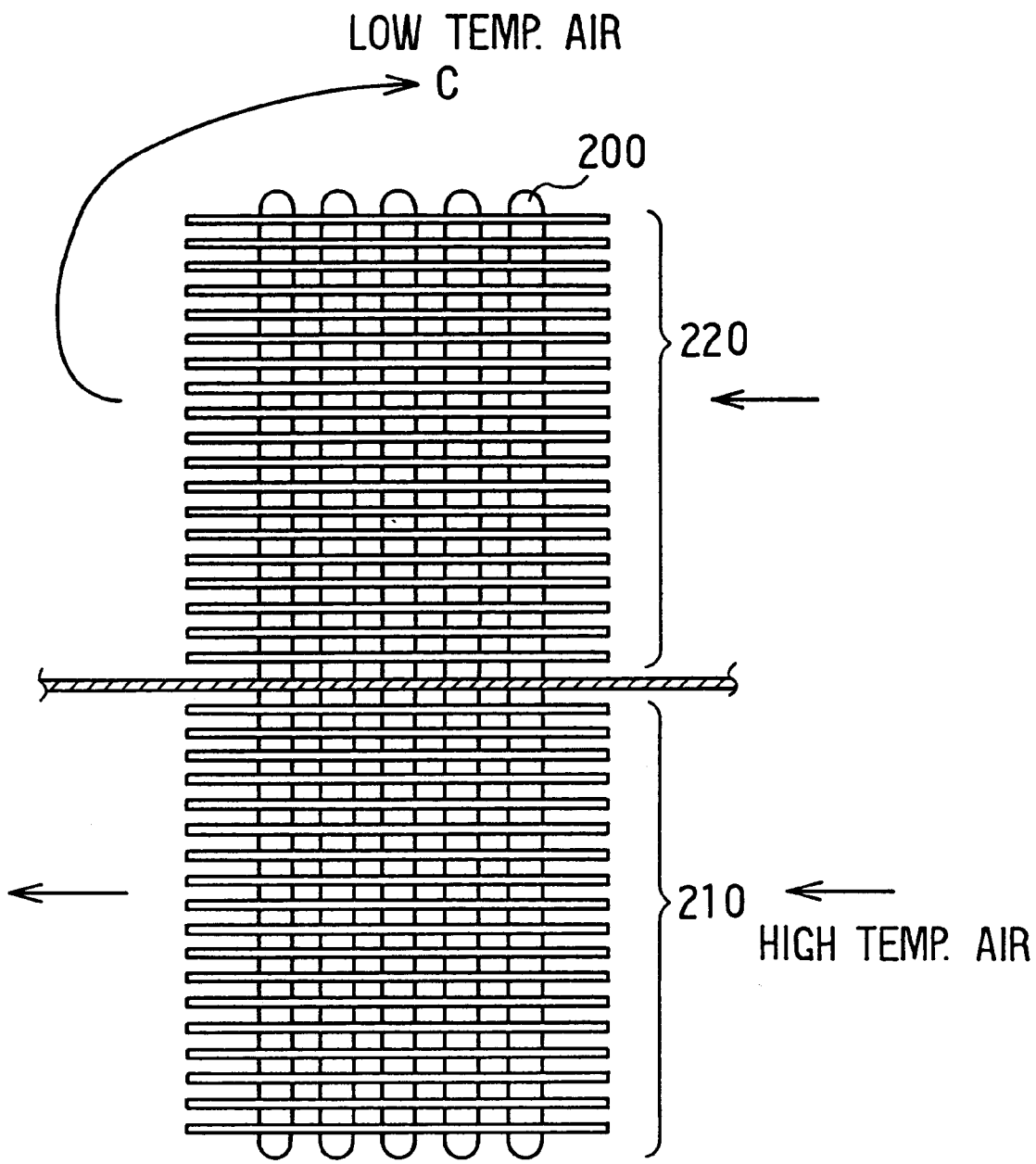
FIG. 15 is partial side view showing a conventional cooling device using a heat pipe.

As shown in FIGS. 11, two upper side blower units 131 and two lower side blower units 134 are used. Each upper side blower unit 131 is a turbo fan of a centrifugal type blower, and generates air flow within the low-temperature-side heat transmission space 118. As shown in FIGS. 14A and 14B, each of the upper side blower units 131 includes an electric motor 132, an air suction port 311 for introducing air, and an air exhaust port 312 for discharging air.

Each of the upper side blower units 131 is disposed approximately in parallel with the heat radiating portion 103b to be opposite to the heat radiating portion 103b. Further, the air suction ports 311 of each upper side blower unit 131 are disposed at a side of the heat radiating portion 103b. Outside air (i.e., low temperature air) introduced from the low-temperature-side intake port 126a passes between the heat radiating pipes 104b of the heat radiating portion 103b, and is blown by the upper side blower unit 131 toward the low-temperature side exhaust port 126b. In the sixth embodiment, the air exhaust side of the upper side blower unit 131 is opened toward the low-temperature-side exhaust port 126b.

Each upper side blower unit 131 is disposed to be opposite to the heat radiation portion 103b in such a manner that an intake port center O3 of the upper side blower unit 131 approximately corresponds to the center O1 of the heat radiating portion 103b. As shown in FIGS. 14A and 14B, the intake port center O3 of the upper side blower unit 131 is shifted from a center of a blower casing. In an opposite portion of the intake port center O3, an intake amount of the blower unit 131 becomes small. Therefore, in the sixth embodiment, the high-temperature-side connection pipe 109a is disposed to be opposite to the opposite portion of the intake port center O3.

Each lower side blower unit 134 is a turbo fan of a centrifugal type blower, and generates air flow within the high-temperature-side heat transmission space 117. Each lower side blower unit 134 includes an electric motor 135 for rotating the turbo fan.

The structure of the lower side blower unit 134 is similar to that of the upper side blower unit 131, and thus the explanation of the lower side blower unit 134 is omitted.

The lower side blower unit 134 is disposed approximately in parallel with the heat receiving portion 103a to be opposite to the heat receiving portion 103a. Further, an air suction port of the lower side blower unit 134 is disposed at a side of the heat receiving portion 103a. Inside air (i.e., high temperature air) introduced from the high-temperature-side intake port 127a passes between the heat receiving pipes 104a of the heat receiving portion 103a.

Each lower side blower unit 134 is disposed to be opposite to the heat receiving portion 103a in such a manner that an intake port center O3 of the lower side blower unit 134 approximately corresponds to the center O2 of the heat receiving portion 103a. As shown in FIGS. 14A and 14B, the intake port center O3 of the lower side blower unit 134 is shifted from a center of a blower casing. In an opposite portion of the intake port center O3, an intake amount of the blower unit 134 becomes small. Therefore, in the sixth embodiment, the low-temperature-side connection pipe 109b is disposed to be opposite to the opposite portion of the intake port center O3.

The position of the low-temperature-side connection pipes 109b at the heat receiving portion 103a and the position of the high-temperature-side connection pipes 109a at the heat radiating portion 103b are made symmetrical, and the discharging directions of the high-temperature inside air and the low-temperature outside air are provided symmetrically. Therefore, for the blower units 131 and 134, the same shaped (i.e., the same scroll direction) fans can be used. Thus, the blower units 131 and 134 are manufactured at a low cost.

In the sixth embodiment, the distance between the outside end (i.e., left side end in FIG. 10) of the lower side blower unit 134 and the inside end (i.e., right side end in FIG. 10) of the upper side blower unit 131 in the lateral direction in FIG. 10 is set to be smaller than the total thicknesses of the thicknesses of the upper and lower blower units 131 and 134 as well as an additional thickness between the heat receiving portion 103a and the heat radiating portion 103b in the lateral direction in FIG. 10.

When the temperature within the inner space 16 is lower than a lower limit temperature (e.g., 0), the electric heater heats air flowing in the high-temperature-side heat transmission space 117 to maintain the temperature within the inner space 16 at a temperature more than the lower limit temperature. The electric heater has a heat generating value of 1.2 KW, for example.

The controller 124 is for controlling the electric devices such as the two electric motors 132 of the upper side blower units 131, the two electric motors 135 of the lower side blower units 134, and the electric heater or the like based on the detected temperature in the inner space 116 provided by a temperature sensor (not shown) composed of thermo-sensitive elements such as thermistor or the like.

The controller 124 operates the two upper side blower units 131 and the two lower side blower units 134 in Hi-operation (i.e., a large amount of air) or a Lo-operation (i.e., a small amount of air) when the temperature in the inner space 116 is greater than the lower limit temperature, and turns off the electric heater. In the sixth embodiment, the controller 124 operates the two upper side blower units 131 and the two lower side blower units 134 in such a manner that the blower units 131 and 134 have the same amount of air with substantially the same rotational speed of the blower units during a normal operation (i.e., day time) in which the temperature in the inner space 116 is not less than the lower limit temperature. Then, at night time or mid-night, the rotational speed of at least one of the two upper side blower units 131 is decreased (relative to the normal operation) to decrease the amount of blown-air and in turn the rotational speed of at least one of the two lower side blower units 134 is increase (relative to the normal operation) to increase the amount of blown-air. With such an arrangement, during the night time and mid-night where noise becomes a problem when the upper side blower units 131 ar operated, it is possible to reduce noise of the upper side blower units 131. Further, the controller 124 turns off the two electric motors 132 for the two upper side blower units 131, and performs a Hi-operation (i.e., a large amount of air) or a Lo-operation (i.e., a small amount of air) of the two electric motors 135 for the lower side blower units 134 when the temperature in the inner space 116 is below the lower limit temperature (e.g., 0), and turns on the electric heater.

The maintenance hatch 128 is detachably disposed at the side of the heat receiving portion 103a. When the cooling device is operated, the maintenance hatch 128 is closed. When performing cleaning operations, the maintenance hatch 128 is opened.

In the sixth embodiment, the plurality of boiling units 103 (e.g., three boiling units) are disposed in the flowing directions of the high-temperature air (i.e., inside air) and the low-temperature air (i.e., outside air).

An operation of the sixth embodiment will now be described.

When the electronic parts 111 is operated, the temperature of the interior of the inner space 116 becomes high. The lower side blower unit 134 generates a circulation of inside air having a high temperature and introduces the high-temperature inside air into the heat receiving portion 103a. Refrigerant sealed in each heat receiving pipe 104a of the heat receiving portion 103a receives heat transmitted by the inside air through the heat transmission fins 106a, and is boiled and evaporated. The evaporated refrigerant vapor flows into the high-temperature-side upper tank 141a of the heat receiving portion 103a and is introduced into the low-temperature-side upper tank 141b. The evaporated refrigerant vapor in the low-temperature-side upper tank 141b is distributed into each heat radiating pipe 104b of the heat radiating portion 103b, and is condensed and liquefied on the inner wall surfaces of each heat radiating pipe. The condensed latent heat of the refrigerant is transmitted to low-temperature outside air through the heat transmission fins 106b. The condensed and liquefied refrigerant drops along the inner wall surfaces by its own weight into the low-temperature-side lower tank 142b. The dropped refrigerant in the low-temperature-side lower tank 142b further drops into the high-temperature-side lower tank 142a of the heat receiving portion 103a through the low-temperature side connection pipes 109b. In this case, the upper side blower unit 131 continues to introduce the low-temperature outside air from the outside into the heat radiating portion 103b. By repeating the boiling and condensing of the refrigerant, it is possible to effectively radiate the heat of the electronic parts 111 to the outside without mixing the high-temperature inside air with the low-temperature outside air.

According to the sixth embodiment, the heat receiving portion 103a includes the plurality of the heat receiving pipes 104a, and is disposed opposite to the lower side blower units 134. Further, the heat radiating portion 103b includes the plurality of heat radiating pipes 104b, and is disposed at an upper side of the heat receiving portion 103a, shifted to the side of the lower side blower unit 134 in the lateral direction in FIG. 10. That is, the upper side blower units 131 are disposed at an upper side of the heat receiving portion 103a opposite to the heat radiating portion 103b at the inner side (i.e., the side of the inner space 116 side). Thus, the thickness of the panel cooler 125 in the lateral direction can be reduced, and the velocity distribution of the panel cooler 125 in the longitudinal direction can be made uniform. Further, the high-temperature-side connection pipes 109a and the low-temperature-side connection pipes 109b for communicating the heat receiving pipes 104a of the heat receiving portion 103a and the heat radiating pipes 104b of the heat radiating portion 103b are bent as shown in FIG. 10. In the sixth embodiment, two connection pipes 109a and two connection pipes 109b are used. Because the number of the connection pipes 109a and 109b are smaller than any one of the number of the heat receiving pipes 104a and the number of heat radiating pipes 104b, the boiling unit 103 is manufactured at a low cost even when the connection pipes 109a and 109b are bent.

Further, the heat receiving portion 103a is disposed approximately in parallel with the lower side blower units 134, and the heat radiating portion 103b is disposed approximately in parallel with the upper side blower units 131. Therefore, the velocity distribution in the heat radiating portion 103b and the heat receiving portion 103a in the longitudinal direction thereof can be made uniform. Thus, the thickness of the panel cooler 125 in the lateral direction can be reduced, and the velocity distribution of the panel cooler 125 in the longitudinal direction can be made uniform.

Because each of the blower units 134 and 131 is a centrifugal type blower, each of the blower units 131 and 134 can be respectively disposed near the heat receiving portion 103a and heat radiating portion 103b. Thus, the thickness of the panel cooler 125 in the lateral direction of FIG. 10 can be further reduced.

Further, the fluid partition plate 102 is disposed obliquely relative to the heat receiving portion 103a and the heat radiating portion 103b. Therefore, water vapor mixed into the low-temperature outside air rapidly drops to the lower side of the fluid partition plate 102. Further, the connection pipes 109a and 109b are approximately perpendicular to the fluid partition plate 102. Thus, assembly between the connection pipes 109a and 109b and the fluid partition plate 102 can be improved.

The heat receiving portion 103a is a flat type heat exchanger having clearances between the heat transmission fins 106a through which the high-temperature inside air flows, and the heat radiating portion 103b is also a flat type heat exchanger having clearances between the heat transmission fins 106b through which the low-temperature outside air flows. The heat receiving portion 103a is shifted in the lateral direction in FIG. 10 to the side of the upper side blower units 131, and the heat radiating portion 103b is shifted in the lateral direction in FIG. 10 to the side of the lower side blower units 134. Further, in the panel cooler 125, the distance between the outside end (i.e., left side end in FIG. 10) of the lower side blower unit 134 and the inside end (i.e., right side end in FIG. 10) of the upper side blower unit 131 in the lateral direction in FIG. 10 is set to be smaller than the total thicknesses of the thicknesses of the upper and lower side blower units 131 and 134 as well as an additional thickness between the heat receiving portion 103a and the heat radiating portion 103b in the lateral direction in FIG. 10. Further, the inner cross-sectional areas of the connection pipes 109a and 109b for connecting the heat receiving portion 103a and the heat radiating portions 103b is made smaller than any one of the inner cross-sectional area of the heat receiving portion 103a and the inner cross-sectional area of the heat radiating portion 103b. Thus, the thickness of the panel cooler 125 can be reduced, and the velocity distribution of the panel cooler 125 in the longitudinal direction can be made uniform. Further, the connection pipes 109a and 109b can be manufactured at a low cost.

According to the sixth embodiment, the air suction ports of the lower side blower units 134 are disposed at the side of the heat receiving portion 103a, and the air suction ports 311 of the upper side blower units 131 are disposed at the side of the heat radiating portion 103b. Further, the flow direction of the high-temperature inside air passing through the heat receiving portion 103a is opposite to the flow direction of the low-temperature outside air passing through the heat-radiating portion 103b. Further, air in which the flow has been adjusted in the heat receiving portion 103a and the heat radiating portion 103b is sucked into the blower units 131 and 134. As a result, in the blower units 131 and 134, air resistance becomes small, and noise can be lowered. Further, the distance between the heat receiving portion 103a and the lower side blower units 134, and the distance between the heat radiating portion 103b and the upper side blower units 131 can be reduced. In the sixth embodiment, air passes through the heat receiving portion 103a and the heat radiating portion 103b perpendicular to the heat transmission fins 106a and 106b.

According to the sixth embodiment, the center O3 of the intake port of the upper side blower unit 131 approximately corresponds to the center O1 of the heat radiating portion 103b, and the center O3 of the intake port of the lower side blower unit 134 approximately corresponds to the center O2 of the heat receiving portion 103a. Therefore, velocity distributions of the heat receiving portion 103a and the heat radiating portion 103b can be made uniform in the longitudinal direction and the lateral direction.

The connection portion between the heat radiating portion 103b and the connection pipes 109a and 109b is shifted from the connection portion between the heat receiving portion 103a and the connection pipes 109a and 109b to the side of the heat radiating portion 103b in the lateral direction in FIG. 10. Therefore, the thickness of the panel cooler 125 in the lateral direction can be reduced.

Further, as shown in FIG. 12, the width of the heat receiving portion 103a in the laminated direction of the heat receiving pipes 104a is approximately equal to the width of the heat radiating portion 103b in the laminated direction of the heat radiating pipes 104b, and the heat receiving portion 103a and the heat radiating portion 103b are disposed to be shifted relative to each other in the laminated direction. Further, the high-temperature-side connection pipe 109a is disposed in the shifted position of the heat radiating portion 103b, and the low-temperature-side connection pipe 109b is disposed in the shifted position of the heat receiving portion 103a. Therefore, the whole width of the panel cooler 125 can be reduced.

Further, because the air suction port of the lower side blower unit 134 is disposed at the side of the heat receiving portion 103a and the air suction port 311 of the upper side blower unit 131 is disposed at the side of the heat radiating portion 103b, the heat receiving portion 103a and the heat radiating portion 103b are used as protection nets for the blower units 131 and 134. In the upper side blower unit 131, the fan is disposed at the side where outside air is introduced to protect the electric motor 132 using a boss portion of the blower unit 134.

The fin pitch of the heat transmission fins 106a of the heat receiving portion 103a is smaller than that of the heat transmission fins 106b of the heat radiating portion 103b. Therefore, when the flow amount of the high-temperature inside air is increased, a flow speed of inside air passing through the heat receiving portion 103b is increased and a decrease of time to transmit the heating amount of the high-temperature inside air to the heat transmission fins 106a can be compensated.

Further, as shown in FIG. 10, the high-temperature-side intake port 127a and the high-temperature-side exhaust port 127b are provided at the upper portion and the lower portion of the rear side partition plate 127. Therefore, high-temperature inside air is smoothly introduced into the high-temperature side heat transmission space 117 and is further introduced into the heat receiving portion 103a to maintain the temperature of the inner space 116 at a uniform temperature.

Although the present invention has been fully described in connection with preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A cooling device boiling and condensing refrigerant, said cooling device comprising:

a case having an interior;

a fluid partition member for partitioning said interior into a first fluid passage and a second fluid passage;

a first heat exchanger in which the refrigerant flows, said first heat exchanger being disposed in said first fluid passage to perform heat exchange between the refrigerant and first fluid flowing through said first fluid passage;

a second heat exchanger in which the refrigerant flows, said second heat exchanger being disposed in said second fluid passage to perform heat exchange between the refrigerant and second fluid flowing through said second fluid passage;

a connection pipe for communicating said first heat exchanger and said second heat exchanger;

a first blower unit, disposed in said first fluid passage, for blowing the first fluid into said first heat exchanger; and a second blower unit, disposed in said second fluid passage, for blowing the second fluid into said second heat exchanger, wherein:

said first fluid passage has a first fluid-flowing portion between said first heat exchanger and said second heat exchanger; and said first heat exchanger and said second heat exchanger are disposed in such a manner that the first fluid from one side of said first heat exchanger flows into the other side of said first heat exchanger through said first fluid-flowing portion and further passes through said first heat exchanger from the other side toward the one side of said first heat exchanger.

2. The cooling device according to claim 1, wherein:

said first heat exchanger includes a plurality of first pipes through which the refrigerant flows and a first tank for communicating said first pipes;

said second heat exchanger includes a plurality of second pipes through which the refrigerant flows and a second tank for communicating said second pipes; and said connection pipe connects said first tank and said second tank to communicate said first tank and said second tank with each other.

3. The cooling device according to claim 1, wherein said connection pipe is disposed in said first fluid-flowing portion.

4. The cooling device according to claim 3, further comprising:

a heat insulation member disposed around said connection pipe to interrupt heat-transmission between the refrigerant in said connection pipe and the first fluid passing through said first fluid-flowing portion.

5. The cooling device according to claim 1, wherein said connection pipe is disposed outside said first fluid-flowing portion.

6. The cooling device according to claim 1, wherein said first blower unit and said second blower unit are disposed at the same side relative to said first heat exchanger and said second heat exchanger.

7. The cooling device according to claim 1, wherein:

said first blower unit has a first suction port for sucking the first fluid therein; and said first heat exchanger is disposed to be opposite to said first suction port of said first blower unit.

8. The cooling device according to claim 7, wherein:

said second blower unit has a second suction port for sucking the second fluid therein; and said second heat exchanger is disposed to be opposite to said second suction port of said second blower unit.

9. The cooling device according to claim 7, wherein said first blower unit is a centrifugal type blower.

10. The cooling device according to claim 1, wherein:

said fluid partition member air-tightly partitions said interior to form a sealed inner space for accommodating a heat-generating member, in such a manner that said first fluid passage communicates with said sealed inner space and said second fluid passage communicates with the outside of said case;

said first heat exchanger and said first blower unit are disposed in said first fluid passage; and said second heat exchanger and said second blower unit are disposed in said second fluid passage.

11. The cooling device according to claim 10, wherein:

said first fluid is inside air of said sealed inner space, having a high temperature; and said second fluid is outside air having a low temperature.

12. The cooling device according to claim 11, wherein:

said first fluid passage has an inside air intake port for introducing inside air into said first heat exchanger, and an inside air exhaust port for discharging the inside air having passed through said first heat exchanger into said sealed inner space by operating said first blower unit;

said second air passage has an outside air intake port for introducing outside air into said second heat exchanger, and an outside air exhaust port for discharging the outside air having passed through said second heat exchanger into the outside of said case by operating said second blower unit;

said inside air intake port is provided at a position higher than said inside air exhaust port; and said outside air exhaust port is provided at a position higher than said outside air intake port.

13. The cooling device according to claim 10, wherein said second heat exchanger is disposed at an upper side of said first heat exchanger.

14. The cooling device according to claim 13, wherein:

said first blower unit is disposed to be opposite to said first heat exchanger;

said second blower unit is disposed to be opposite to said second heat exchanger; and said first blower unit and said second blower unit are disposed at the same side outside said first heat exchanger and said second heat exchanger.

15. The cooling device according to claim 10, wherein:

said case has a rotary shaft at one side thereof;

said second heat exchanger and said second blower unit are disposed to rotate integrally around said rotary shaft; and said first blower unit and said second blower unit are disposed inside relative to said first heat exchanger and said second heat exchanger.

16. The cooling device according to claim 1, wherein:

said first heat exchanger is disposed at a lower side of said second heat exchanger in such a manner that: refrigerant within said first heat exchanger is boiled by receiving heat from the first fluid, the boiled refrigerant vapor flows into said second heat exchanger through said connection pipe, the boiled refrigerant vapor is condensed in said second heat exchanger by radiating heat to the second fluid, and the condensed refrigerant returns to said first heat exchanger though said connection pipe.

17. The cooling device according to claim 3, wherein the first fluid has a temperature lower than that of the second fluid.

18. The cooling device according to claim 3, wherein the first fluid has a temperature higher than that of the second fluid.

19. A cooling device boiling and condensing refrigerant, said cooling device comprising:
- a case having an interior;
- a fluid partition member for partitioning said interior into a first fluid passage and a second fluid passage;
- a heat exchanger including:
  - a first heat exchanger having a plurality of first pipes through which the refrigerant flows and a first tank for communicating said first pipes, said first heat exchanger being disposed in said first fluid passage to perform heat exchange between the refrigerant and first fluid flowing through said first fluid passage, said first heat exchanger having a plurality of first heat exchanger portions disposed in the flow direction of the first fluid to have a first arrangement;
  - a second heat exchanger having a plurality of second pipes through which the refrigerant flows and a second tank for communicating said second pipes, said second heat exchanger being disposed in said second fluid passage to perform heat exchanger between the refrigerant and second fluid flowing through said second fluid passage, said second heat exchanger having a plurality of second heat exchanger portions disposed in the flow direction of the second fluid to have a second arrangement, said second heat exchanger portions have the same number as said first heat exchanger portions, said connection pipe having a plurality of connection pipe portions, said connection pipe portions being connected to said first heat exchanger portions and said second heat exchanger portions in a cross shape, said first heat exchanger portions being disposed at a lower side of said second heat exchanger portions in such a manner that said first arrangement is opposite to said second arrangement;
  - a first blower unit, disposed in said first fluid passage, for blowing the first fluid into said first heat exchanger; and
  - a second blower unit, disposed in said second fluid passage, for blowing the second fluid into said second heat exchanger, wherein:
    said first heat exchanger and said second heat exchanger are disposed in such a manner that a flow direction of the first fluid passing through said first heat exchanger is in the same direction as a flow direction of the second fluid passing through said second heat exchanger.

20. The cooling device according to claim 19, wherein said first blower unit and said second blower unit are disposed at the same side relative to said first heat exchanger and said second heat exchanger.

21. The cooling device according to claim 19, wherein:
said first blower unit has a first suction port for sucking the first fluid therein; and
said first heat exchanger is disposed to be opposite to said first suction port of said first blower unit.

22. The cooling device according to claim 21, wherein:
said second blower unit has a second suction port for sucking the second fluid therein; and
said second heat exchanger is disposed to be opposite to said second suction port of said second blower unit.

23. The cooling device according to claim 21, wherein said first blower unit is a centrifugal type blower.

24. The cooling device according to claim 19, wherein:
said fluid partition member air-tightly partitions said interior to form a sealed inner space for accommodating a heat-generating member, in such a manner that said first fluid passage communicates with said sealed inner space and said second fluid passage communicates with the outside of said case;
said first heat exchanger and said first blower unit are disposed in said fist fluid passage; and
said second heat exchanger and said second blower unit are disposed in said second fluid passage.

25. The cooling device according to claim 24, wherein:
said first fluid is inside air of said sealed inner space, having a high temperature; and
said second fluid is outside air having a low temperature.

26. The cooling device according to claim 25, wherein:
said first fluid passage has an inside air intake port for introducing inside air into said first heat exchanger, and an inside air exhaust port for discharging the inside air having passed through said first heat exchanger into said sealed inner space by operating said first blower unit;
said second air passage has an outside air intake port for introducing outside air into said second heat exchanger, and an outside air exhaust port for discharging the outside air having passed through said second heat exchanger into the outside of said case by operating said second blower unit;
said inside air intake port is provided at a position upper than said inside air exhaust port; and
said outside air exhaust port is provided at a position upper than said outside air intake port.

27. The cooling device according to claim 24, wherein said second heat exchanger is disposed at an upper side of said first heat exchanger.

28. The cooling device according to claim 19, wherein:
said first blower unit is disposed to be opposite to said first heat exchanger;
said second blower unit is disposed to be opposite to said second heat exchanger; and
said first blower unit and said second blower unit are disposed at the same side outside said first heat exchanger and said second heat exchanger.

29. The cooling device according to claim 24, wherein:
said case has a rotary shaft at one side thereof;
said second heat exchanger and said second blower unit are disposed to rotate integrally around said rotary shaft; and
said first blower unit and said second blower unit are disposed inside relative to said first heat exchanger and said second heat exchanger.

30. The cooling device according to claim 19, wherein:
said first heat exchanger is disposed at a lower side of said second heat exchanger in such a manner that: refrigerant within said first heat exchanger is boiled by receiving heat from the first fluid, the boiled refrigerant vapor flows into said second heat exchanger through said connection pipe, the boiled refrigerant vapor is condensed in said second heat exchanger by radiating heat to the second fluid, and the condensed refrigerant returns to said first heat exchanger through said connection pipe.

* * * * *